(12) United States Patent
Chan et al.

(10) Patent No.: US 8,080,326 B2
(45) Date of Patent: *Dec. 20, 2011

(54) METHOD OF OPERATING AN ELECTRICAL ENERGY STORAGE DEVICE USING MICROCHANNELS DURING CHARGE AND DISCHARGE

(75) Inventors: Alistair K. Chan, Bainbridge Island, WA (US); Roderick A. Hyde, Redmond, WA (US); Jordin T. Kare, Seattle, WA (US); Lowell L. Wood, Jr., Bellevue, WA (US)

(73) Assignee: The Invention Science Fund I, LLC

( * ) Notice: Subject to any disclaimer, the term of this patent is extended or adjusted under 35 U.S.C. 154(b) by 397 days.

This patent is subject to a terminal disclaimer.

(21) Appl. No.: 12/455,020

(22) Filed: May 26, 2009

(65) Prior Publication Data

US 2010/0304256 A1  Dec. 2, 2010

Related U.S. Application Data

(63) Continuation-in-part of application No. 12/455,034, filed on May 26, 2009, and a continuation-in-part of application No. 12/455,031, filed on May 26, 2009, and a continuation-in-part of application No. 12/455,036, filed on May 26, 2009, and a continuation-in-part of application No. 12/455,015, filed on May 26, 2009, and a continuation-in-part of application No. 12/455,019, filed on May 26, 2009, and a continuation-in-part of application No. 12/455,023, filed on May 26, 2009, and a continuation-in-part of application No. 12/455,037, filed on May 26, 2009, and a continuation-in-part of application No. 12/455,016, filed on May 26, 2009, and a continuation-in-part of application No. 12/455,025, filed on May 26, 2009.

(51) Int. Cl.
*H01M 10/50* (2006.01)

(52) U.S. Cl. .......................................... 429/62; 429/120

(58) Field of Classification Search .................... 429/39, 429/41, 62, 120, 231.5, 231.9, 523
See application file for complete search history.

(56) References Cited

U.S. PATENT DOCUMENTS 3,290,176 A  12/1966  Berju et al.
(Continued)

FOREIGN PATENT DOCUMENTS

WO  WO 01/31053 A1  5/2001

OTHER PUBLICATIONS

PCT International Search Report; International App. No. PCT/US2010/001563; bearing a date of Sep. 23, 2010; pp. 1-4.

(Continued)

*Primary Examiner* — Thanh Tam Le

(57) ABSTRACT

A method is generally described which includes operating an electrical energy storage device or an electrochemical energy generation device includes placing an electrical load to draw current from the electrical energy storage device or the electrochemical energy generation device. The electrical energy storage device or the electrochemical energy generation device includes a housing having an external surface and an internal surface. The method also includes generating electricity by at least one component within the housing. At least one component is configured to generate electrical energy in combination with other components, chemicals, or materials residing within the housing. Further, the method includes thermal control the electrical energy storage device by transferring heat to a plurality of microchannels coupled to at least one of the internal surface of the housing or at least one components. Further still, the method includes rejecting the collected heat through a thermal sink coupled to the microchannels. The thermal sink is configured to transfer heat energy from the microchannels and to receive a fluid flowing through the microchannels.

44 Claims, 16 Drawing Sheets

U.S. PATENT DOCUMENTS

| | | | |
|---|---|---|---|
| 3,901,731 A | | 8/1975 | Warszawski et al. |
| 4,403,018 A | | 9/1983 | Alfenaar et al. |
| 4,505,992 A | * 3/1985 | Dettling et al. | 429/457 |
| 4,541,040 A | | 9/1985 | Allfather |
| 4,561,040 A | | 12/1985 | Eastman et al. |
| 4,804,592 A | * 2/1989 | Vanderborgh et al. | 429/484 |
| 4,973,530 A | | 11/1990 | Vanderborgh et al. |
| 5,230,966 A | | 7/1993 | Voss et al. |
| 5,663,595 A | | 9/1997 | Shiomi et al. |
| 5,858,567 A | | 1/1999 | Spear, Jr. et al. |
| 6,265,836 B1 | | 7/2001 | Aoki |
| 6,472,095 B2 | | 10/2002 | Margiott |
| 6,503,298 B1 | | 1/2003 | Monzyk et al. |
| 6,653,002 B1 | | 11/2003 | Parise |
| 6,689,500 B2 | * 2/2004 | Nelson | 429/439 |
| 6,749,010 B2 | | 6/2004 | Getz, Jr. et al. |
| 6,821,666 B2 | * 11/2004 | Morse et al. | 429/535 |
| 6,942,018 B2 | | 9/2005 | Goodson et al. |
| 6,976,532 B2 | | 12/2005 | Zhan et al. |
| 6,991,024 B2 | | 1/2006 | Goodson et al. |
| 7,131,486 B2 | | 11/2006 | Goodson et al. |
| 7,156,159 B2 | | 1/2007 | Lovette et al. |
| 7,185,697 B2 | | 3/2007 | Goodson et al. |
| 7,226,675 B2 | | 6/2007 | Ovshinsky et al. |
| 7,271,567 B2 | * 9/2007 | Dunn et al. | 320/101 |
| 7,326,480 B2 | * 2/2008 | Fuglevand | 429/9 |
| 7,334,630 B2 | | 2/2008 | Goodson et al. |
| 7,335,437 B2 | | 2/2008 | Blank et al. |
| 7,393,369 B2 | | 7/2008 | Shurtleff |
| 7,428,137 B2 | | 9/2008 | Dowgiallo, Jr. |
| 7,448,441 B2 | | 11/2008 | Hendricks et al. |
| 7,537,851 B2 | * 5/2009 | Lee et al. | 429/424 |
| 7,611,792 B2 | | 11/2009 | Tonkin et al. |
| 7,645,530 B2 | | 1/2010 | Buechi et al. |
| 7,648,786 B2 | | 1/2010 | Shurtleff et al. |
| 7,651,797 B2 | * 1/2010 | Markoski et al. | 429/448 |
| 7,830,117 B2 | * 11/2010 | Ambrosio et al. | 320/109 |
| 7,901,817 B2 | * 3/2011 | Markoski et al. | 429/414 |
| 2003/0207156 A1 | | 11/2003 | Ovshinsky et al. |
| 2004/0071944 A1 | | 4/2004 | Weir et al. |
| 2005/0250002 A1 | | 11/2005 | Stanley et al. |
| 2006/0194095 A1 | | 8/2006 | Vyas et al. |
| 2006/0231233 A1 | | 10/2006 | Farid et al. |
| 2007/0042667 A1 | | 2/2007 | Sung |
| 2007/0068714 A1 | | 3/2007 | Bender |
| 2007/0259229 A1 | | 11/2007 | Tung et al. |
| 2007/0264546 A1 | | 11/2007 | LaVen |
| 2007/0284095 A1 | | 12/2007 | Wang et al. |
| 2008/0044725 A1 | | 2/2008 | Sadoway et al. |
| 2008/0206608 A1 | | 8/2008 | Lienkamp et al. |
| 2009/0068521 A1 | | 3/2009 | Buchinger et al. |
| 2009/0253001 A1 | * 10/2009 | Ito | 429/17 |

OTHER PUBLICATIONS

PCT International Search Report; International App. No. PCT/US2010/001564; bearing a date of Sep. 23, 2010; pp. 1-4.

"Advanced Microstructure Cooling Loop"; Cooligy; pp. 1-2; printed on Oct. 22, 2008; located at: http://www.cooligy.com/micro_structure_cooling.html.

Chen, X.Y. et al.; "Direct Liquid Cooling of a Stacked Multichip Module"; IEEE-Electronics Packaging Technology Conference; dated 2002; pp. 380-384.

"Microchannel Cooling: Why Smaller Means Cooler"; Cooligy; pp. 1-2; printed on Oct. 22, 2008; located at: http://www.cooligy.com/microchannels.html.

Pamula, Vamsee et al.; "Cooling of Integrated Circuits Using Droplet-Based Microfluidics"; Great Lakes Symposium on VLSI: Proceedings of the $13^{th}$ ACM Great Lakes Symposium on VLSI; dated 2003; pp. 84-87.

Tuckerman, D.B. et al.; "High-Performance Heat Sinking for VLSI"; IEEE-Electron Device Letters; May 1981; pp. 126-129; vol. EDL-2, No. 5.

Tuckerman, David B. et al.; "Ultrahigh Thermal Conductance Microstructures for Cooling Integrated Circuits"; IEEE-Electronics Laboratories Symposium; dated 1982; pp. 145-149.

Hendricks et al.; "Enhancement of Pool Boiling Heat Transfer using Nanostructured Surfaces on Aluminum and Copper"; International Journal of Heat and Mass Transfer; 2010 and printed on Jun. 11, 2010; pp. 1-28; vol. 53; Elsevier B.V.

Upadhya, Girish; "Cooligy Active Micro-Structure Cooling Offers Key to Advanced Processor Performance and Quieter Systems"; dated Jun. 2, 2006; pp. 1-6; located at: www.cooligy.com.

\* cited by examiner

METHOD OF OPERATING AN ELECTRICAL ENERGY STORAGE DEVICE USING MICROCHANNELS DURING CHARGE AND DISCHARGE

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a continuation-in-part of U.S. patent application Ser. No. 12/455,034 filed May 26, 2009, entitled SYSTEM AND METHOD OF ALTERING TEMPERATURE OF AN ELECTRICAL ENERGY STORAGE DEVICE OR AN ELECTROCHEMICAL ENERGY GENERATION DEVICE USING MICROCHANNELS, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,031 filed May 26, 2009, entitled SYSTEM AND METHOD OF ALTERING TEMPERATURE OF AN ELECTRICAL ENERGY STORAGE DEVICE OR AN ELECTROCHEMICAL ENERGY GENERATION DEVICE USING HIGH THERMAL CONDUCTIVITY MATERIALS, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,036 filed May 26, 2009, entitled METHOD OF OPERATING AN ELECTRICAL ENERGY STORAGE DEVICE OR AN ELECTROCHEMICAL ENERGY GENERATION DEVICE USING HIGH THERMAL CONDUCTIVITY MATERIALS DURING CHARGE AND DISCHARGE, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,015 filed May 26, 2009, entitled SYSTEM FOR ALTERING TEMPERATURE OF AN ELECTRICAL ENERGY STORAGE DEVICE OR AN ELECTROCHEMICAL ENERGY GENERATION DEVICE USING MICROCHANNELS BASED ON STATES OF THE DEVICE, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,019 filed May 26, 2009, entitled SYSTEM FOR ALTERING TEMPERATURE OF AN ELECTRICAL ENERGY STORAGE DEVICE OR AN ELECTROCHEMICAL ENERGY GENERATION DEVICE USING HIGH THERMAL CONDUCTIVITY MATERIALS BASED ON STATES OF THE DEVICE, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,023 filed May 26, 2009, entitled SYSTEM FOR OPERATING AN ELECTRICAL ENERGY STORAGE DEVICE OR AN ELECTROCHEMICAL ENERGY GENERATION DEVICE USING MICROCHANNELS BASED ON MOBILE DEVICE STATES AND VEHICLE STATES, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,037 filed May 26, 2009, entitled SYSTEM AND METHOD OF OPERATING AN ELECTRICAL ENERGY STORAGE DEVICE OR AN ELECTROCHEMICAL ENERGY GENERATION DEVICE USING THERMAL CONDUCTIVITY MATERIALS BASED ON MOBILE DEVICE STATES AND VEHICLE STATES, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,016 filed May 26, 2009, entitled SYSTEM AND METHOD OF OPERATING AN ELECTRICAL ENERGY STORAGE DEVICE OR AN ELECTROCHEMICAL ENERGY GENERATION DEVICE, DURING CHARGE OR DISCHARGE USING MICROCHANNELS AND HIGH THERMAL CONDUCTIVITY MATERIALS, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/455,025 filed May 26, 2009, entitled SYSTEM AND METHOD OF OPERATING AN ELECTRICAL ENERGY STORAGE DEVICE OR AN ELECTROCHEMICAL ENERGY GENERATION DEVICE USING MICROCHANNELS AND HIGH THERMAL CONDUCTIVITY MATERIALS, naming Alistair K. Chan, Roderick A. Hyde, Jordin T. Kare and Lowell L. Wood, Jr. as inventors, filed contemporaneously herewith, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, *Benefit of Prior-Filed Application*, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

BACKGROUND

The description herein generally relates to the field of microchannel thermal control systems for electrical energy storage devices or electrochemical energy generation devices. Microchannel cooling has been conventionally applied to devices such as integrated circuit devices and laser diodes. However, microchannel cooling has seen limited application in cooling of electrical energy storage devices or electrochemical energy generation devices.

Conventionally, there is a need for advantageous structures and methods for thermal control of electrical energy storage devices or electrochemical energy generation devices by the use of microchannels and the like in a variety of structures and in a variety of usage.

SUMMARY

In one aspect, a method of altering an electrical energy storage device or an electrochemical energy generation device includes placing an electrical load to draw current from the electrical energy storage device or the electrochemical energy generation device. The electrical energy storage device or the electrochemical energy generation device includes a housing having an external surface and an internal surface. The method also includes generating electricity by at least one component within the housing. At least one component is configured to generate electrical energy in combination with other components, chemicals, or materials residing within the housing. Further, the method includes thermal control of the electrical energy storage device by transferring heat to a plurality of microchannels coupled to at least one of the internal surface of the housing or at least one components. Further still, the method includes rejecting the collected heat through a thermal sink coupled to the microchannels. The thermal sink is configured to transfer heat energy from the microchannels and to receive a fluid flowing through the microchannels.

In another aspect, a method of providing power from an electrical energy storage device or an electrochemical energy generation device includes providing the electrical energy storage device or the electrochemical energy generation device including a housing and including internal components within the housing. The method also includes providing a microchannel fluid thermal control system integrated into at least one of the interior of the housing or the internal components. Further, the method includes configuring the electrical energy storage device or the electrochemical energy generation device for a platform for at least partially discharging the electrical energy storage device or the electrochemical energy generation device and using electrical energy from the electrical energy storage device or the electrochemical energy generation device.

In yet another aspect a method of providing power from an electrical energy storage device or an electrochemical energy generation device includes receiving the electrical energy storage device or the electrochemical energy generation device including a housing and including internal components within the housing. The method also includes receiving a microchannel fluid thermal control system integrated into at least one of the interior of the housing or the internal components. Further, the method includes discharging power at least partially from the electrical energy storage device or the electrochemical energy generation device. The electrical energy storage device or the electrochemical energy generation device is configured for a platform for discharging the power source and using the electrical energy from the electrical energy storage device or the electrochemical energy generation device. Further still, the method includes discharging heat from the fluid flowing through the microchannel fluid thermal control system.

In yet still another aspect, a method of charging an electrical energy storage device includes configuring the electrical energy storage device to receive electrical current to charge the electrical energy storage device, the electrical energy storage device including a housing having an external surface and an internal surface. The method also includes configuring at least one component within the housing. At least one component is configured to generate electrical energy, during a discharge phase, in combination with other components, chemicals, or materials residing within the housing and at least one component configured to receive electrical charge during a charge phase. Further, the method includes providing a plurality of microchannels coupled to at least one of the internal surface of the housing or the at least one internal components to receive heat generated during the charge phase and providing a fluid within the microchannels. Further still, the method includes providing a thermal sink, to collect the heat from the fluid, coupled to the microchannels, the thermal sink being configured to transfer heat energy to or from the fluid flowing through the microchannels and the thermal sink.

In yet still another aspect, a method of charging an electrical energy storage device, includes placing the electrical energy storage device to draw current from a charging source. The electrical energy storage device includes a housing having an external surface and an internal surface. The method also includes receiving electricity by at least one component within the housing. At least one component is configured to receive electrical energy in combination with other components, chemicals, or materials residing within the housing. Further, the method includes thermal control of the electrical energy storage device by transferring heat to a plurality of microchannels coupled to at least one of the internal surface of the housing or the at least one internal components. Further still, the method includes transferring collected heat through a thermal sink coupled to the microchannels. The thermal sink is configured to transfer heat energy to or from the microchannel and receive a fluid flowing through the microchannels and the thermal sink.

In still yet further another aspect, a method of charging an electrical energy storage device, includes receiving the electrical energy storage device including a housing and including internal components within the housing. The method also includes integrating a microchannel fluid thermal control system into at least one of the interior of the housing or the internal components. Further, the method includes receiving current by the electrical energy storage device, from a charging source.

In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer. Also various structural elements may be employed depending on design choices of the system designer.

In addition to the foregoing, other system aspects are described in the claims, drawings, and text forming a part of the present disclosure.

In addition to the foregoing, various other method and/or system and/or program product aspects are set forth and described in the teachings such as text (e.g., claims and/or detailed description) and/or drawings of the present disclosure.

The foregoing is a summary and thus contains, by necessity, simplifications, generalizations and omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

The foregoing summary is illustrative only and is not intended to be in any way limiting. In addition to the illustrative aspects, embodiments, and features described above, further aspects, embodiments, and features will become apparent by reference to the drawings and the following detailed description, of which.

DETAILED DESCRIPTION

Figure 1:
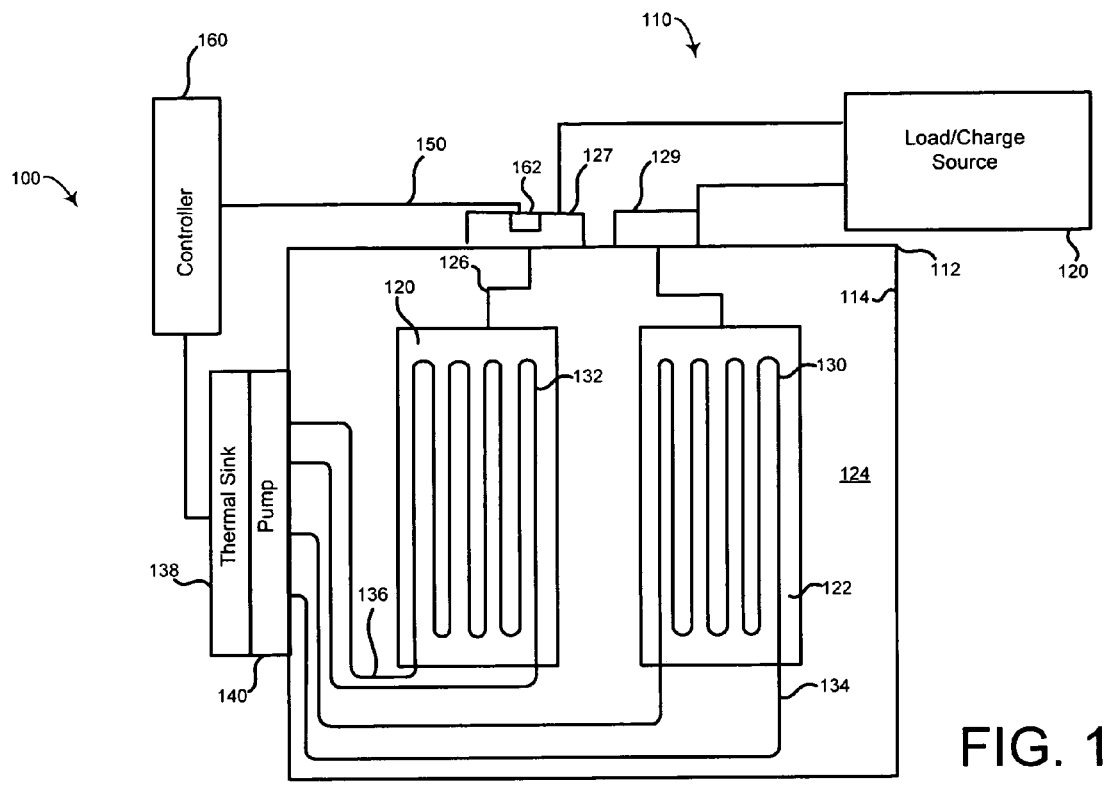
FIG. 1 is an exemplary microchannel temperature alteration system associated with an electrical energy storage device or an electrochemical energy generation device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Microchannels used to cool integrated circuits have been understood since the early 1980s and disclosed in research published by professors Dr. David Tuckerman and Dr. Fabian Pease. Pease published research showing that microchannels etched into silicon may provide densities as high as 1000 W per square centimeter. Such microchannel structures have been shown to be put into practical use by cooling integrated circuits, such as those described in U.S. Pat. Nos. 4,541,040; 7,156,159; 7,185,697; and U.S. Patent Application Publication No. 2006/0231233 all of which are herein incorporated by reference. However, practical application to thermal control of electrical energy storage devices and electrochemical energy generation devices has not been accomplished or suggested. Such microchannel structures may particularly be suited for removing heat from such devices especially in the case of ultrahigh power density batteries or other electrical storage devices, for example hyper capacitors, or electrochemical energy generation devices such as, but not limited to fuel cells. Microchannel coolers and passive high thermal conductivity materials, such as, but not limited to diamond films, micro heat pipes, microchannel plates, etc., may be used to aid in thermal control of ultra-high performance nano structured batteries, and the like, which will generate high thermal loads and high thermal power densities, particularly during rapid charging, and/or during rapid discharging. Such devices may be exemplified by the electrical energy storage device as described in U.S. Published Patent Application No. 2008/0044725, which is herein incorporated by reference. The reference also describes some of the demands which may be fulfilled by such high power density electrical energy storage devices.

Efficiency of microstructure microchannel heat collectors and thermal sinks, maybe attributed to the heat generated by the energy storage or electrochemical energy generation devices travelling a relatively small distance from the heat generation point in the electrical energy storage device, or electrochemical energy generation device, where the heat is generated and transferred through the walls of the microchannel. Also, the heat from the walls of the microchannel conducts a very small distance into the fluid before the heat energy is carried away to a thermal sink, such as a radiator, or the like. Because of the structure of the microchannels where the height of the microchannel is typically much greater than the width, it may be incorporated into various portions internally of the electrical energy storage device or the electrochemical energy generation device. For example, the microchannel thermal control structures may be incorporated into the anode, or the cathode of a battery or electrochemical energy generation device. Further, the microchannel structures may be integrated into walls of the housing of an electrical energy storage device or an electrochemical energy generation device. Further, the microchannel structures may be incorporated into other portions internally of the electrical energy storage device or electrochemical energy generation device.

One of the advantages of using the microchannel structures is that turbulent flow within the channels is not necessary to increase heat transfer efficiency. Microchannel structures neither require nor create turbulent flow. Conventional macrochannels require turbulence to increase cooling efficiency otherwise the fluid flowing in the middle of the channel stays relatively cool. Turbulent flow within the fluid channel mixes the hot fluid next to the wall of the channel with the cooler fluid in the middle of the channel. However, such turbulence and mixing decreases the efficiency of cooling. Microchannels, instead, have the advantage that the heat transfer coefficient "h" is inversely proportional to the width of the channel. As "h" decreases efficiency increases. A very narrow channel completely heats a very thin layer of fluid as it travels through the collector.

A compact thermal control system for electrical energy storage devices and electrochemical energy generation devices which may be used in applications such as, but not limited to mobile devices, electric vehicles, hybrid electric vehicles, etc. maybe based on micro heat exchangers having microchannel heat collectors or heat collectors at least partially formed of high thermal conductivity materials. Such microchannel heat collectors may be machined or fabricated in silicon or other metals, or other materials including high thermal conductivity materials and use active pumps systems or passive systems including, but not limited to electro osmotic pumps or other pumps, etc. A system such as this may be a hermetically closed system that may be arranged in a modular fashion in which a portion of microchannels or a portion of a high thermal conductivity material heat collector is disposed within the housing of the electrical energy storage device or the electrochemical energy generation device. Other configurations may be such that the microchannels or other heat collector are incorporated or machined directly into portions of the electrical energy storage device or electrochemical energy generation device. Such microchannel heat exchangers, and such systems as described, may be formed as extremely compact and power efficient systems such that the total system offers increased performance characteristics heat pipes, vapor chambers, and other heat transfer devices which are conventionally used for removing heat from similar types of electrical energy storage devices and electrochemical energy generation devices.

Referring now to FIG. 1, a thermal control system 100 for an electrical energy storage device or an electrochemical energy generation device 110 is depicted. Electrical energy storage device or electrochemical energy generation device 110 may include, but is not limited to any of a variety of batteries or electrochemical cells such as, but not limited to lithium based batteries, lithium ion batteries, lithium ion nano phosphate batteries, lithium sulfur batteries, lithium ion polymer batteries, sodium sulfur batteries, etc. In fact, such thermal control technology could be applied to any typical type of electrochemical cell in existence today or to be developed. Further, other types of electrical energy storage devices may be used in place of battery 110 such as, capacitor devices including, but not limited to capacitive storage devices, inductive storage devices, electrolytic capacitors, hyper capacitors (as described in U.S. Published Patent Application No. 2004/0071944 and U.S. Pat. No. 7,428,137 both of which are herein incorporated by reference), polyvinylidene fluoride (PVDF) based capacitors carbon nanotube based capacitors, other conductive polymer based capacitors, carbon aerogel based capacitors, etc. Further still, energy storage or electrochemical energy generation device 110 may be representative of a fuel cell (as described in U.S. Published Patent Application No. 2009/0068521 which is herein incorporated by reference), or other electrochemical energy generation devices which may be known, or developed.

Electrical energy storage device or electrochemical energy generation device 110 includes a housing 112 having a housing wall with an interior wall surface 114 and exterior wall surface 112. Interior wall surface 114 of housing 112 may be filled with an electrolyte 124 or other material depending on the structure of either the electrical energy storage device or the electrochemical energy generation device 110. Electrical energy storage device or electrochemical energy generation device 110 may include, a cathode 120 coupled to a positive terminal 127 by a conductor 126. In an exemplary embodiment, load 120 may include a number of microchannel structures 132. Microchannel structures 132 may be integrated into cathode 120 or alternatively may be overlaid or coupled to cathode 120 such that heat emanating from cathode 120 may be collected by the microchannel structures 132. Such microchannel structures 132 may be formed by any of a variety of methods including etching, micromachining, and the like. Various materials for forming cathode 120 may be used, as is well known in the art depending on the type of electrical energy storage device or electrochemical energy generation device 110. A fluid connection 136 is coupled to microchannels 132. Fluid connections 136 are coupled to a thermal sink 138 through a pump 140. Such a thermal sink 138 may be a radiator or other form of heatsink. A pump 140 may also be coupled to a fluid circuit 136 in order to move fluid through microchannels 132. In one embodiment, a pump is used. In alternative embodiments, the fluid may be moved by osmotic pressure or the like without use of a pump 140. Similar to cathode 120, an anode 122 is electrically coupled to a negative terminal 129 of electrical energy storage device or electrochemical energy generation device 110 by a conductor 128. Similar to cathode 120, anode 122 may also include a microchannel structure 130 integrated into, overlaid, or coupled to anode 122. Microchannel structure 130 is fluidly coupled, by a fluid connection 134, to thermal sink 138 in much the same way that fluid connection 136 is coupled to thermal sink 138.

In an exemplary embodiment, a load or a charge source 120 is electrically coupled to positive terminal 127 and negative terminal 129 of electrical energy storage device or electrochemical energy generation device 110. Load 120 may be any of a variety of possible devices using energy from electrical energy storage device or electrochemical energy generation device 110. Charge source 120 may be any type of charging device that is used to charge electrical energy storage device 110. During charging, or during discharging by use of a load, large amounts of heat may be generated within electrical energy storage device or electrochemical energy generation device 110. Accordingly, it may be advantageous to use a microchannel thermal control system as described. In one exemplary embodiment, a controller 160 may be coupled to pump 140. Controller 160 may be any of a variety of controllers control devices, etc. for controlling the speed of pump 140. For example, pump 140 may be coupled to a sensor 162 which detects characteristics of electrical energy storage device or electrochemical energy generation device 110. Sensor 162 may be located at any of a variety of locations associated with electrical energy storage device or electrochemical energy generation device 110. Alternatively, controller 160 may be coupled to load or charge source 120 to detect characteristics of the usage of load or charge source 120. Controller 160 may be used to control pump 140 based on a variety of factors including, but not limited to a current draw, a current discharge, voltage, various states of the device using energy from electrical energy storage device or electrochemical energy generation device 110, or variable various states of a vehicle using electrical energy storage device or electrochemical energy generation device 110, or further states of the charge source 120.

In accordance with an exemplary embodiment, it may be desirable to cool the electrical energy storage device or the electrochemical energy generation device in anticipation of a heat generating event, such as discharge or energy demand or charging. By cooling in advance of the heat generating event, the thermal control system may be better enabled to keep up with the cooling demands. It is in a sense a "head start" for the cooling system. In an exemplary embodiment the "head start" may be determined by a processor which may be enabled with programming to monitor systems and make determinations as to when energy may be demanded or charging may occur. In other exemplary embodiments, the "head start" may be done in accordance with a schedule or in accordance with other preset or predetermined times.

Figure 2:
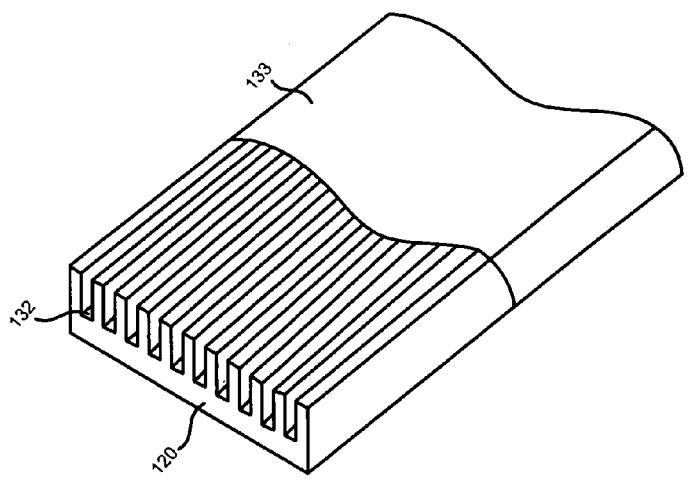
FIG. 2 is an exemplary depiction of a cross section and cutaway of a plurality of microchannels.

Referring now to FIG. 2, a perspective cross-section of an exemplary cathode 120 is depicted. The cross section of FIG. 2 depicts microchannels 132 built into or integrated into cathode 120. Microchannels 132 are sealed fluid conduits having a top portion 133 shown partially cut-away. Microchannels 132 are not shown in a scaled depiction because microchannels 132 conventionally are of extremely small width, on the order of, but not limited to the width of a human hair. The height of microchannels 132 may be much greater than the width to achieve efficient laminar flow thermal control. The high aspect ratio of the microchannels increases the total surface area of the microchannel structures touching the fluid flow. The width of the microchannels 132 may be on the order of 10 μm, but is not limited thereto. FIG. 2 depicts a single configuration of microchannels 132 in which the microchannels are arranged side-by-side and fluid may flow through all the microchannels in parallel or may flow in a serial manner back and forth (serpentine) through each of the microchannels to complete a fluid circuit. Many other configurations of microchannels may also be conceived without departing from the scope of the disclosure and of the invention as claimed herein.

Figure 17:
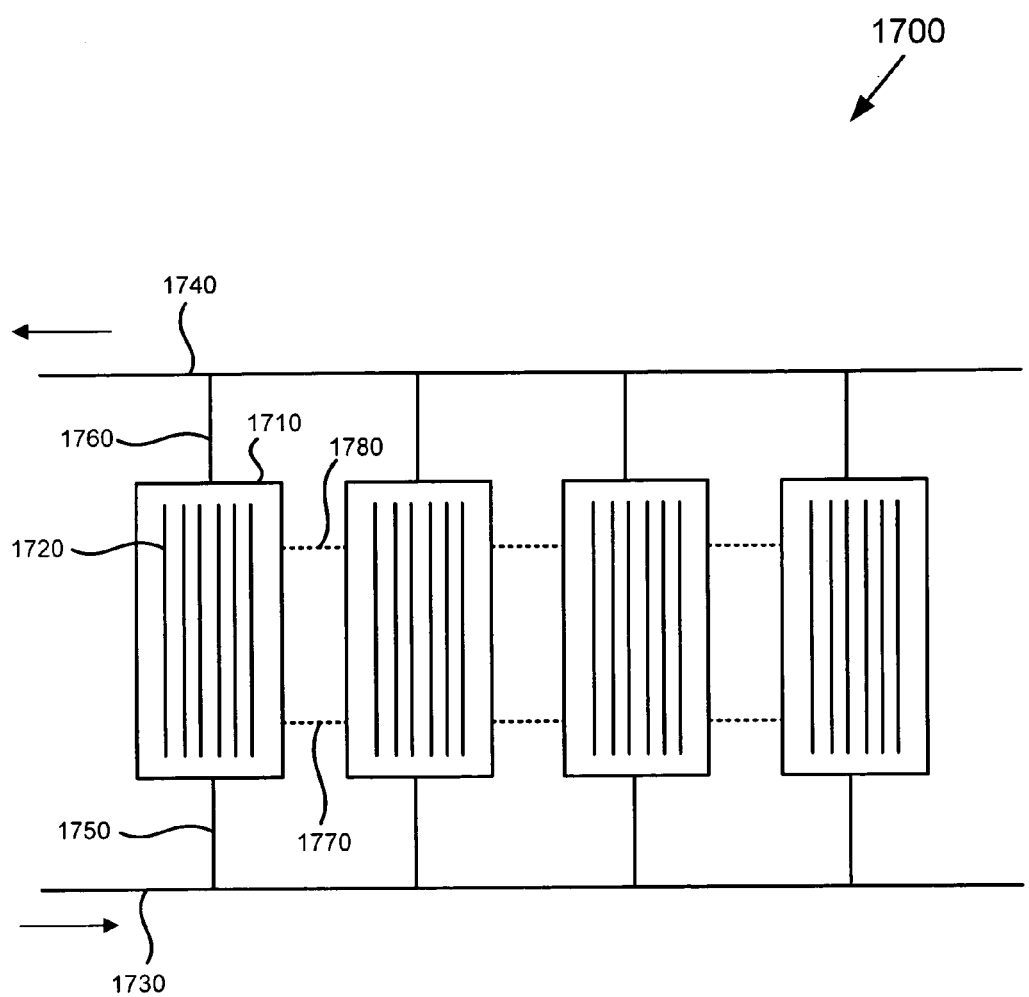
FIG. 17 is an exemplary block diagram of a microchannel manifold system.

Referring now to FIG. 17, an alternative configuration of a microchannel thermal control system 1700 includes more than one of substrates 1710 which support microchannels 1720. Substrates 1710 may be integrated into or otherwise coupled to any of the electrical energy storage device or electrochemical energy generation device components as discussed. Microchannels 1720 may be of a parallel or any other configuration in which fluid may flow from an inlet manifold 1730 to an outlet manifold 1740. Such flow may proceed through any of the more than one sets of microchannels through microchannel inlets 1750 and through microchannel outlets 1760. In yet another configuration each of the sets of microchannels may include one or more interconnections 1770 and 1780 between the sets of microchannels. Providing such a structure has many advantages including, but not limited to performance characteristics, manufacturing characteristics, and application characteristics, as desired.

In one exemplary embodiment, electrical energy storage device or electrochemical energy generation device 110 is an electrical energy storage device that has a housing 112. The housing may have an external and internal surface, the internal surface being depicted as surface 114. Many components reside within the housing including, in some instances, the anode 122 and the cathode 120. Further, other chemicals or materials may also reside within the housing including an electrolyte 124, or other materials or chemicals as needed to generate electricity or to store energy. In one exemplary embodiment a plurality of microchannels is coupled to at least one of the internal surface 114 of the housing or at least one of the internal components such as, but not limited to cathode 120 and anode 122. A thermal sink 138 is coupled to the microchannels fluid connection 136. The thermal sink 138 is configured to transfer heat to or from fluid flowing through microchannels 132. In one exemplary embodiment, microchannels may be formed in a portion of a wall of the housing 114. Also, microchannels may be formed in a portion of any of the components residing within housing 112. In another exemplary embodiment, microchannels may be formed in a portion of a catalyst which may be disposed within housing 112. Further still, microchannels may be formed in electrical contacts, a current carrying conductor, a dialectic, etc. Also, microchannels may be formed integrally to any of these components or housings, or may be overlaid or disposed on or coupled to any of these components or housings. It may be advantageous to couple the microchannels to areas or components where the most heat is generated or collects.

In an exemplary embodiment, the fluid flowing through microchannels 132 may include any of a variety of fluids. Such fluids may include air, gas, water, antifreeze, molten salt, molten metal, micro-particles, liquid droplets, solid particles, etc. (see e.g. US 2006/0231233). Also, in an exemplary embodiment, the fluid may be at least partially circulated by any of a variety of devices including, a pump, a mechanical pump, electromagnetic (MHD) pump, electroosmotic pump, etc. The fluid may be circulated in any of a variety of ways including, by convection, by electroosmosis, etc. Further, in accordance with an exemplary embodiment, the electrical energy storage device may include one or more electrochemical cells, capacitive storage devices, inductive storage devices, electrolytic capacitors, supercapacitors, hypercapacitors, polyvinylidpue fluoride (PVDF) based capacitors, and various batteries, including, but not limited to lithium based batteries, lithium batteries, lithium ion batteries, lithium ion nanophosphate batteries, lithium sulfur batteries, lithium ion polymer batteries, etc.

In accordance with another exemplary embodiment, electrical energy storage device or electrochemical energy generation device 110 is a fuel cell. The fuel cell may include a housing having an external surface and an internal surface 114. At least one component resides within the housing. At least one component is configured to generate electrical power in combination with at least one other components, chemicals, or materials residing within the housing. In one embodiment, such components may include, but are not limited to cathode 120 and anode 122. A plurality of microchannels 132 may be coupled to the least one of the internal surface of the housing or the at least one internal components. A thermal sink 138, is coupled to the microchannels. Thermal sink 138 is configured to transfer heat to or from fluid flowing through the microchannels. In one exemplary embodiment, the microchannels are formed in a portion of a wall of the housing or at least one component residing within the housing. Similar to the electrical energy storage device configuration, many of the same components may reside within the housing and may include microchannels. Further, any other components which may be unique to a fuel cell, compared to the electrical energy storage device depicted in FIG. 1, may also include microchannels to cool such components.

Figure 3:
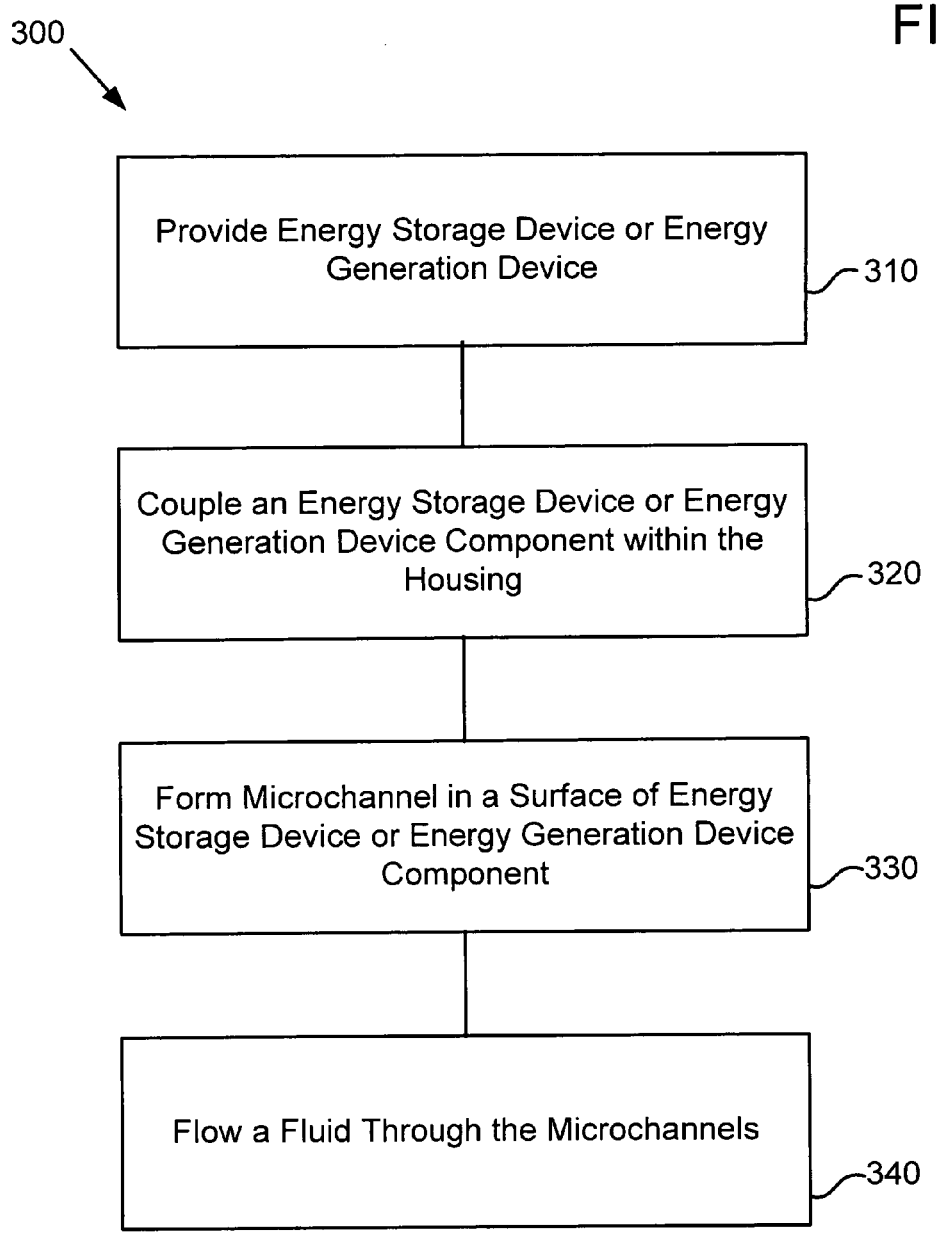
FIG. 3 is an exemplary process diagram for altering temperature of an electrical energy storage device or an electrochemical energy generation device.

Referring now to FIG. 3, a process 300 is depicted for controlling temperature of an electrical energy storage device or electrochemical energy generation device. Process 300 includes providing an electrical energy storage device or an electrochemical energy generation device with a housing (process 310). Process 300 also includes coupling an electrical energy storage device or electrochemical energy generation device components within the housing (process 320). Microchannels are formed in a surface of the electrical energy storage device or the electrochemical energy generation device components (process 330). A fluid is then flowed through the microchannels to provide thermal control to the components and to the overall electrical energy storage device or electrochemical energy generation device (process 340).

Figure 4:
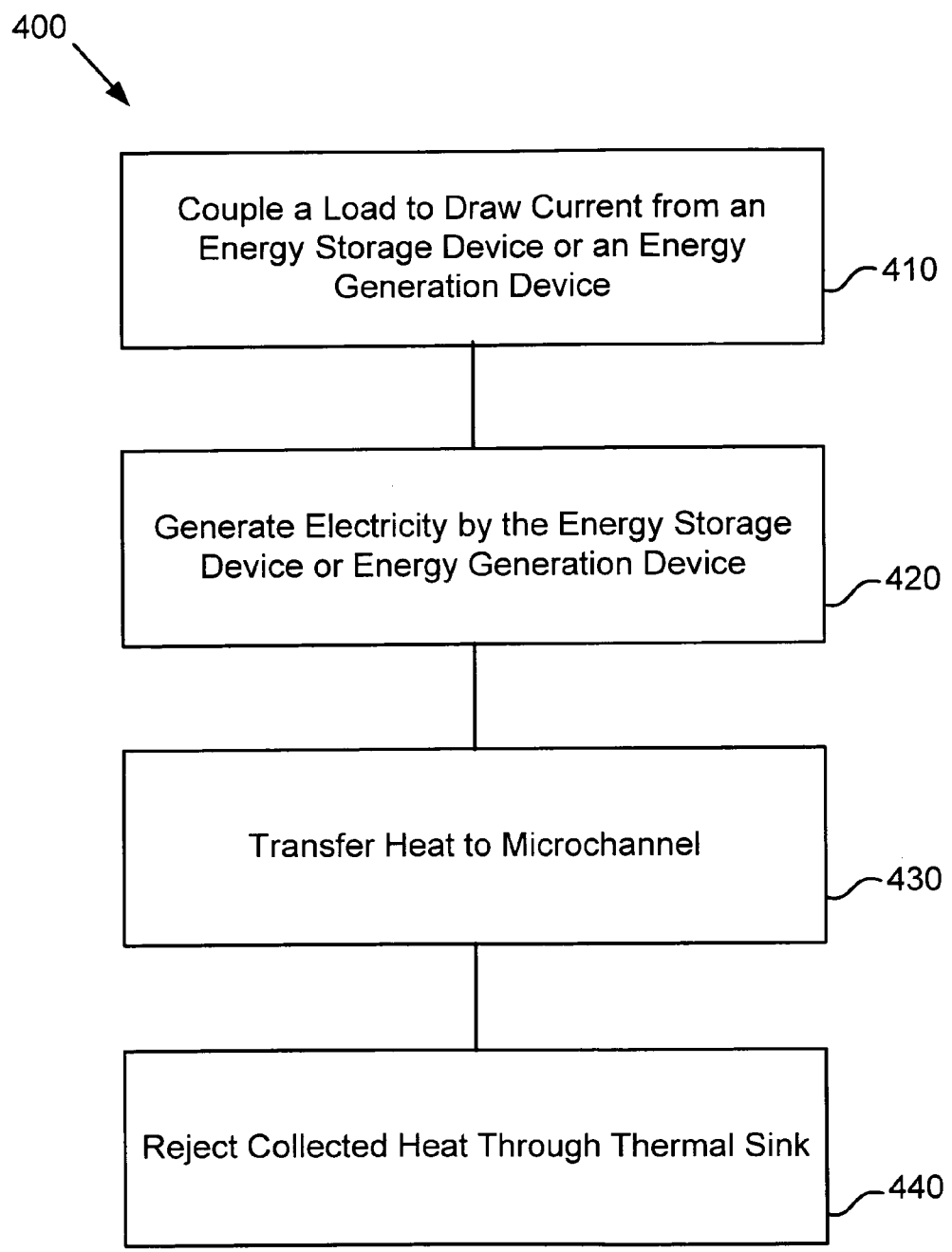
FIG. 4 is an exemplary process diagram for altering temperature of an electrical energy storage device or an electrochemical energy generation device.

Referring now to FIG. 4, a process 400 of using electrical energy storage device or an electrochemical energy generation device is depicted. Process 400 includes coupling a load to draw current from the electrical energy storage device or the electrochemical energy generation device (process 410). The electrical energy storage device or the electrochemical energy generation device has a housing with an external surface and an internal surface. Process 400 also includes generating electricity by the electrical energy storage device or the electrochemical energy generation device using at least one component within the housing. The least one component is configured to generate electrical energy in combination with other components, chemicals, or materials residing within the housing (process 420). The electrical energy storage device is then cooled by transferring heat to fluid flowing through the microchannels coupled to at least one of the internal surface of the housing or at least one of the components (process 430). Heat is then rejected from the thermal sink that is coupled to the microchannels. The thermal sink is configured to transfer heat energy from the microchannels and is configured to receive a fluid flowing through the microchannels (process 440).

In accordance with another exemplary embodiment, a process of providing power for an electrical energy storage device or an electrochemical energy generation device includes providing an electrical energy storage device or an electrochemical energy generation device having a housing and including internal components within the housing. The process also includes providing a microchannel fluid thermal control system integrated into at least one of the interior of the housing or the internal components. Further, the process includes configuring the electrical energy storage device or electrochemical energy generation device for a platform for at least partially discharging the electrical energy storage device or the electrochemical energy generation device and using electrical energy from the electrical energy storage device.

In accordance with yet another exemplary embodiment, a process of providing power from an electrical energy storage device or an electrochemical energy generation device includes receiving the electrical energy storage device or the electrochemical energy generation device housing and including internal components within the housing. The process also includes receiving a microchannel fluid thermal control system integrated into at least one of the interior of the housing or the internal components. Further, the process includes discharging power at least partially from the electrical energy storage device or the electrochemical energy generation device. The electrical energy storage device or the electrochemical energy generation device is configured for a platform for discharging the electrical energy storage device or the electrochemical energy generation device and using the electrical energy from the electrical energy storage device.

Another exemplary process includes charging an electrical energy storage device. The electrical energy storage device is configured to receive electrical current to charge the electrical energy storage device. The electrical energy storage device includes a housing having an external surface and an internal surface. The process for charging the electrical energy storage device also may include configuring at least one component within the housing. The least one component being configured to generate electrical energy during a discharge phase in combination with other complements, chemicals, or materials residing within the housing. At least one component is configured to receive electrical charge during a charge phase. The exemplary process also includes providing a plurality of microchannels coupled to a least one out of the internal surface of the housing or the least one internal components to receive a heat generated during the charge phase and providing a fluid within the microchannels. A thermal sink is also provided to collect heat from the fluid coupled to the microchannels. The thermal sink is configured to transfer heat energy to or from the fluid flowing through the microchannels and the thermal sink.

A method of charging a electrical energy storage device also includes placing the electrical energy storage device to draw current from a charging source. The electrical energy storage device includes a housing having an external surface and an internal surface. The process includes receiving electricity by at least one component within the housing. At least one component is configured to receive electrical energy in combination with other components chemicals, or materials residing within the housing. The process also includes thermal control of the electrical energy storage device by transferring heat to a plurality of microchannels coupled to a least one of the internal surface of the housing or the at least one internal components. Further, the process includes transferring collected heat through the thermal sink coupled to the microchannels. The thermal sink is configured to transfer heat energy to or from the microchannels and receive a fluid through the microchannels in the thermal sink.

Further still, a method of charging an electrical energy storage device is disclosed. The method includes receiving the electrical energy storage device including a housing and including internal components within the housing. The process also includes integrating a microchannel fluid thermal control system into at least one of the interior housing or the internal components. Further, the method includes receiving current by the electrical energy storage device, from a charging source.

Figure 5:
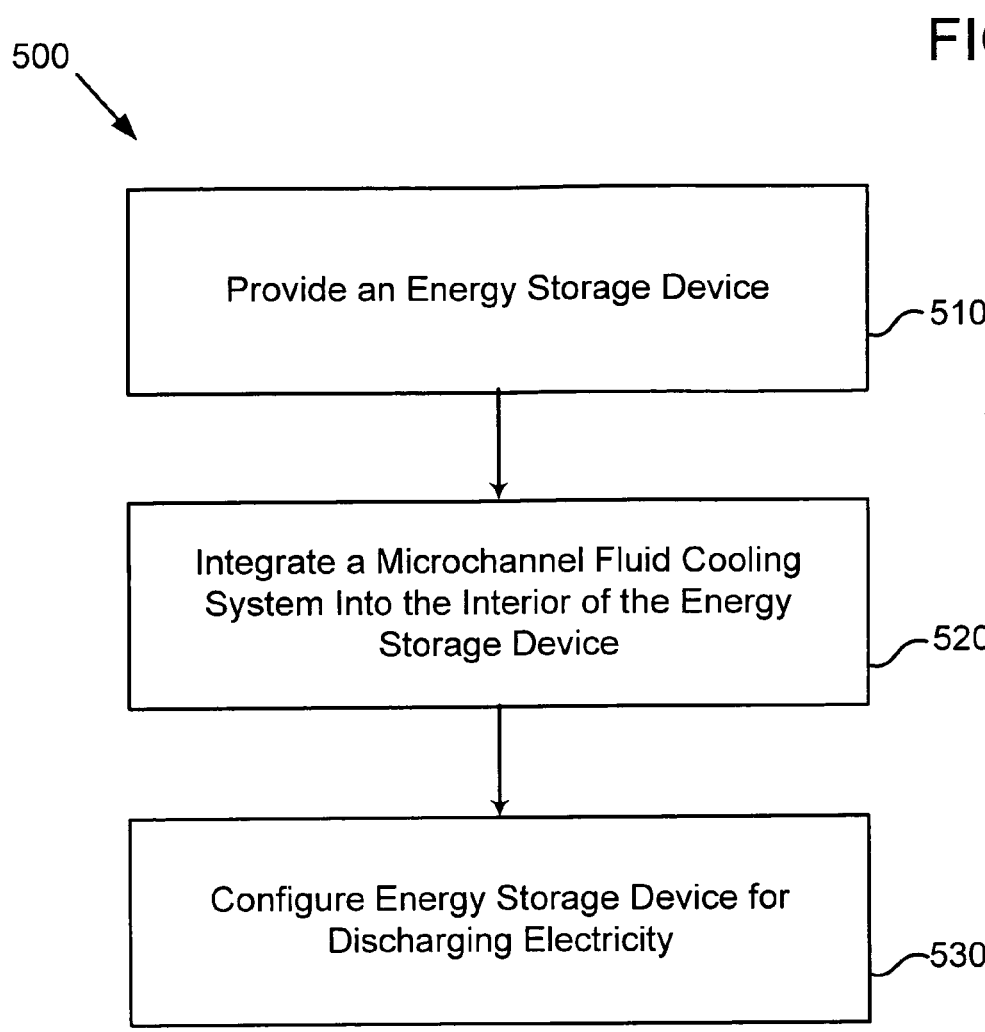
FIG. 5 is an exemplary process diagram for altering temperature of an electrical energy storage device or an electrochemical energy generation device while discharging.

Referring now to FIG. 5, a process 500 for thermal control of an electrical energy storage device during discharge is depicted. Process 500 includes providing an electrical energy storage device (process 510). Process 500 also includes integrating a microchannel fluid thermal control system into the interior of the electrical energy storage device (process 520). Process 500 further includes configuring the electrical energy storage device for discharging electricity (process 530).

Figure 6:
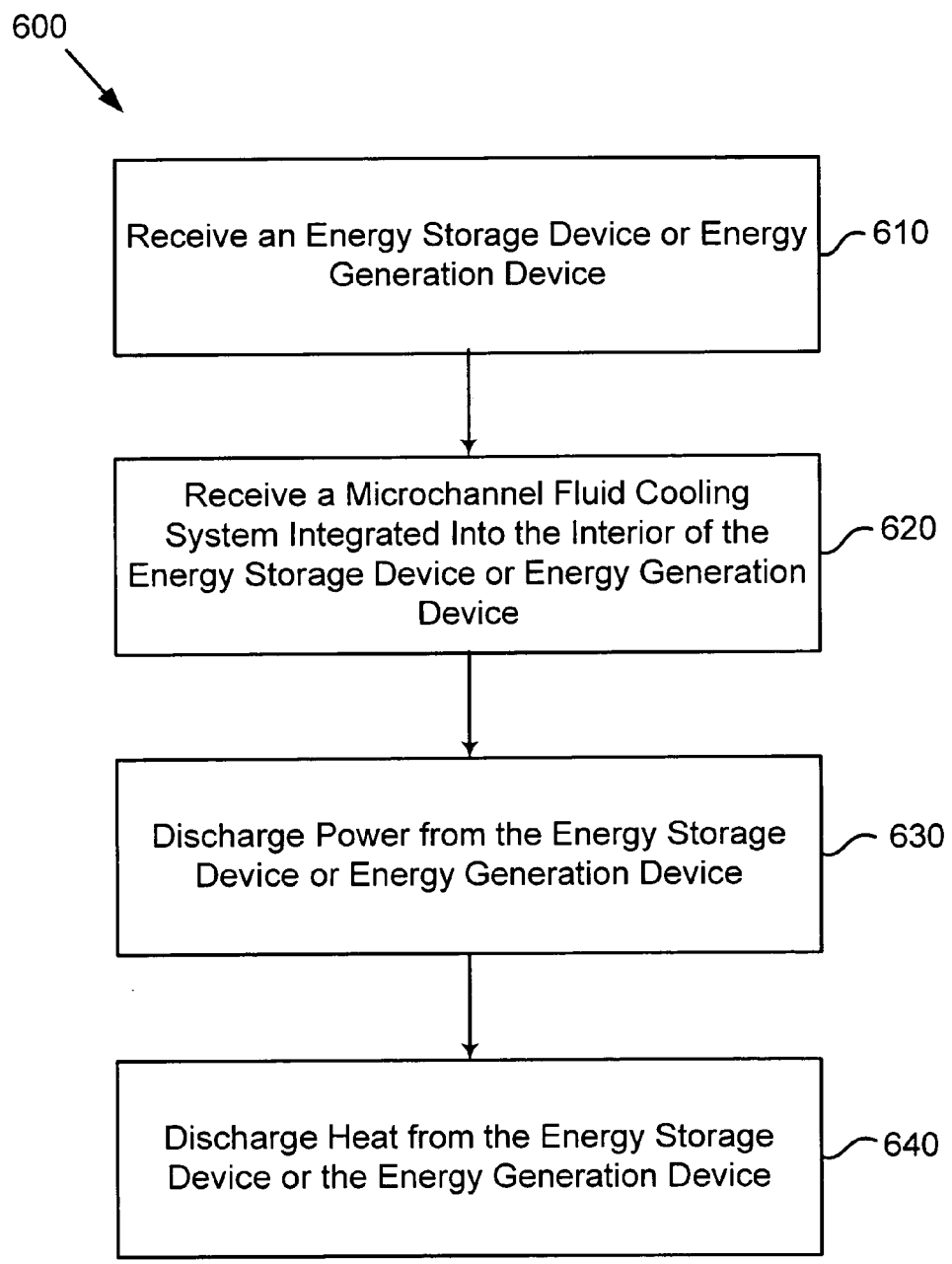
FIG. 6 is an exemplary process diagram for altering temperature of an electrical energy storage device or an electrochemical energy generation device during discharging.

Referring now to FIG. 6, a process for discharging power from a power from an electrical energy storage device or an electrochemical energy generation device is depicted process 600 includes receiving an electrical energy storage device or an electrochemical energy generation device (process 610). Process 600 also includes receiving a microchannel fluid thermal control system that is integrated into the interior of the electrical energy storage device or the electrochemical energy generation device (process 620). Further, process 600 includes discharging power from the electrical energy storage device or the electrochemical energy generation device to a load using the stored or generated electrical energy (process 630). Using the microchannel thermal control system heat is then discharged from the electrical energy storage device or electrochemical energy generation device (process 640).

Figure 7:
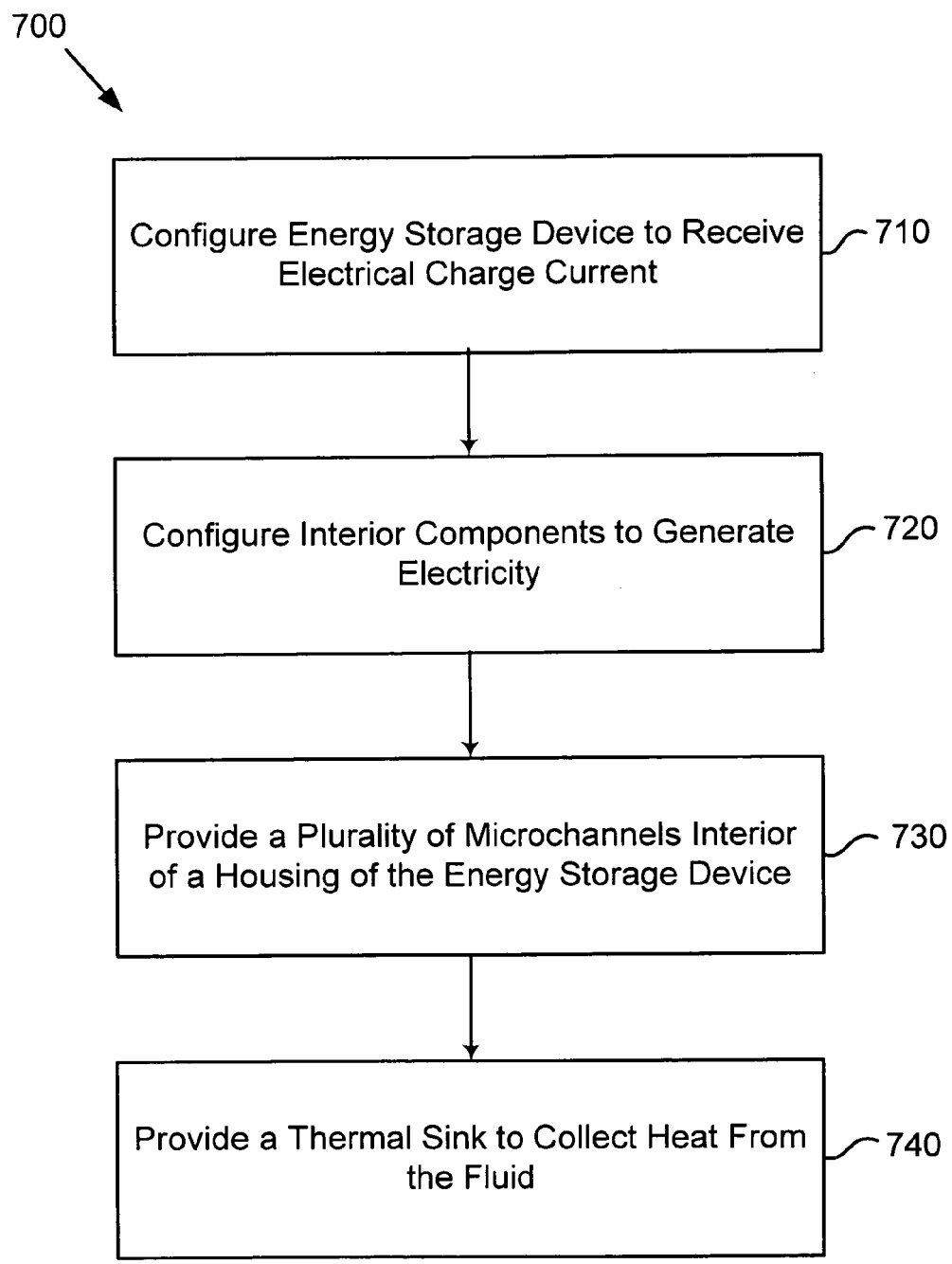
FIG. 7 is an exemplary process diagram for altering temperature of an electrical energy storage device during charging.

Referring now to FIG. 7, a process 700 for thermal control of an electrical energy storage device while charging is depicted. Process 700 includes configuring an electrical energy storage device to receive electrical charge current (process 710). The charge current is used to charge the electrical energy storage device, the electrical energy storage device capable of receiving a high power density current thereby causing heating of the electrical energy storage device and components of the electrical energy storage device. Process 700 also includes configuring interior components of the electrical energy storage device to generate electricity (process 720). Further, process 700 includes providing a plurality of microchannels into the interior of a housing of the electrical energy storage device (process 730). The interior of the housing may include interior surfaces of the housing as well as components within the housing. Further still, process 700 includes providing a radiative structure or a thermal sink that is used to collect heat from the fluids flowing through the microchannels (process 740).

Figure 8:
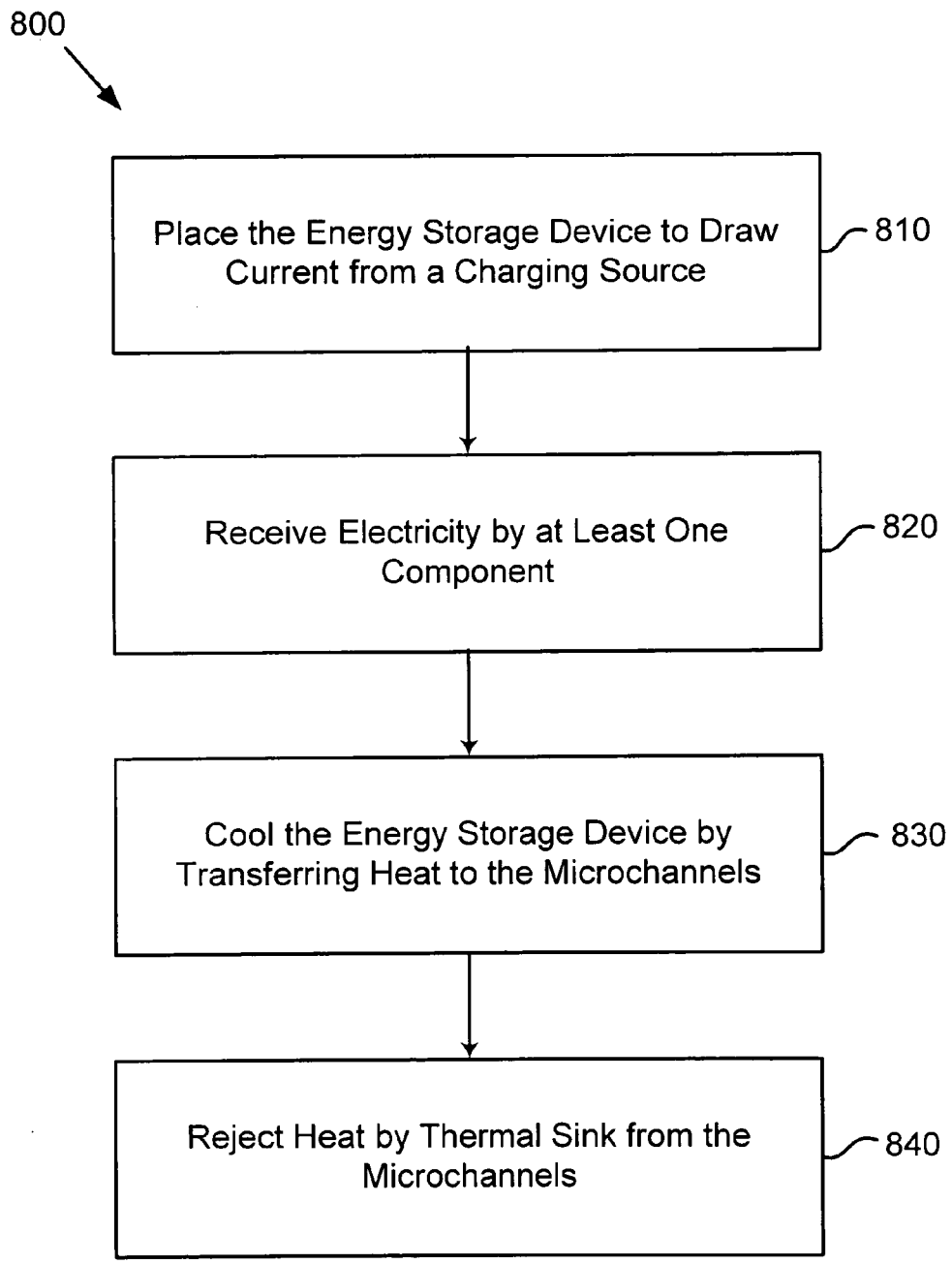
FIG. 8 is an exemplary process diagram for altering temperature of an electrical energy storage device during charging.

Referring now to FIG. 8, a process 800 is depicted for thermal control of an electrical energy storage device during charging. Process 800 includes placing the electrical energy storage device in a situation to draw current from a charging source (process 810). Process 800 also includes receiving electricity by at least one component of the electrical energy storage device (process 820). Because heat is generated within the electrical energy storage device during the charging process, process 800 also includes thermal control of the electrical energy storage device by transferring heat to microchannels which are configured within housing of the electrical energy storage device (process 830). Heat is then rejected via a radiator or other thermal sink structure from the microchannels by transferring heat from the microchannel to the fluid flowing through the microchannels and to the thermal sink (process 840).

Figure 9:
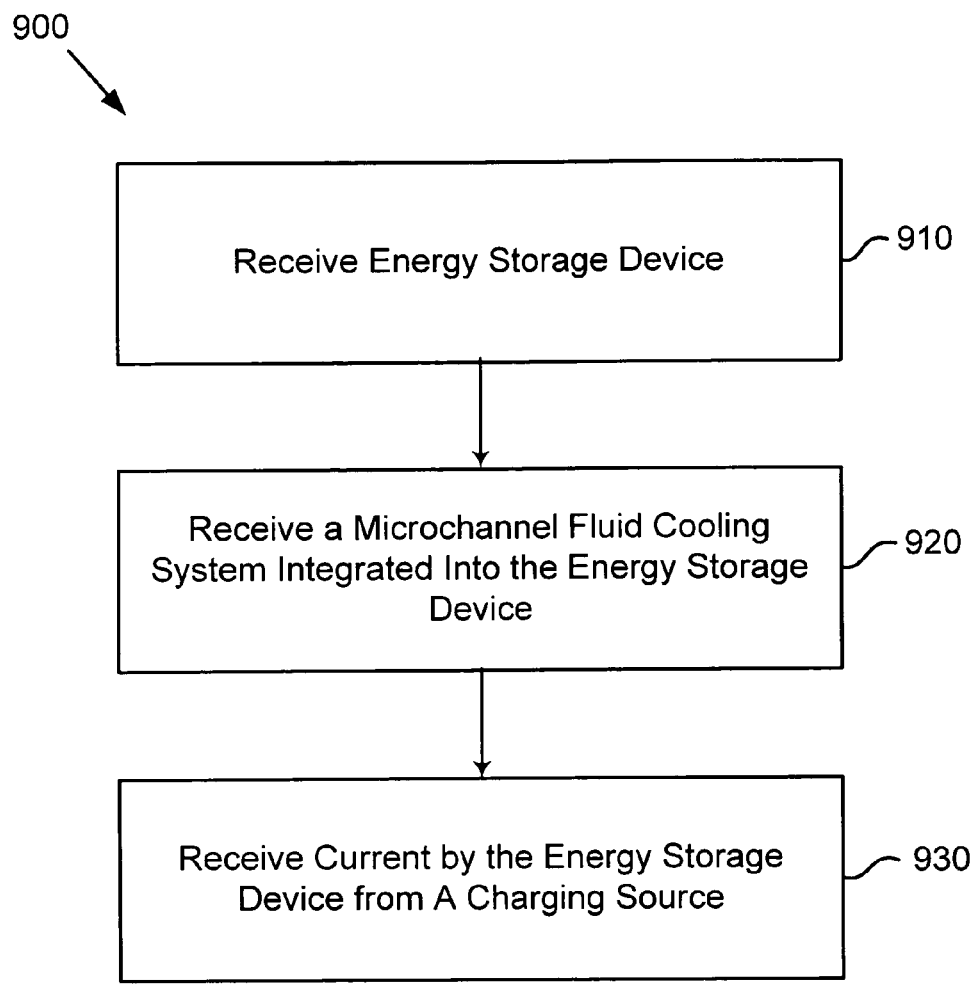
FIG. 9 is an exemplary process diagram for altering temperature of an electrical energy storage device during charging.

Referring now to FIG. 9, a process 900 is depicted for thermal control of an electrical energy storage device during charging. Process 900 includes receiving an electrical energy storage device in a situation whereby the electrical energy storage device may be charged (process 910). Process 900 also includes receiving a microchannel fluid thermal control system is integrated into the electrical energy storage device (process 920). Such a microchannel fluid thermal control system that may be one that is applied directly to components within the housing of the electrical energy storage device or may be one that is integrated into the housing of the electrical energy storage device or components within the housing of the electrical energy storage device. Process 900 also includes receiving current by the electrical energy storage device from the charging source (process 930).

Figure 10:
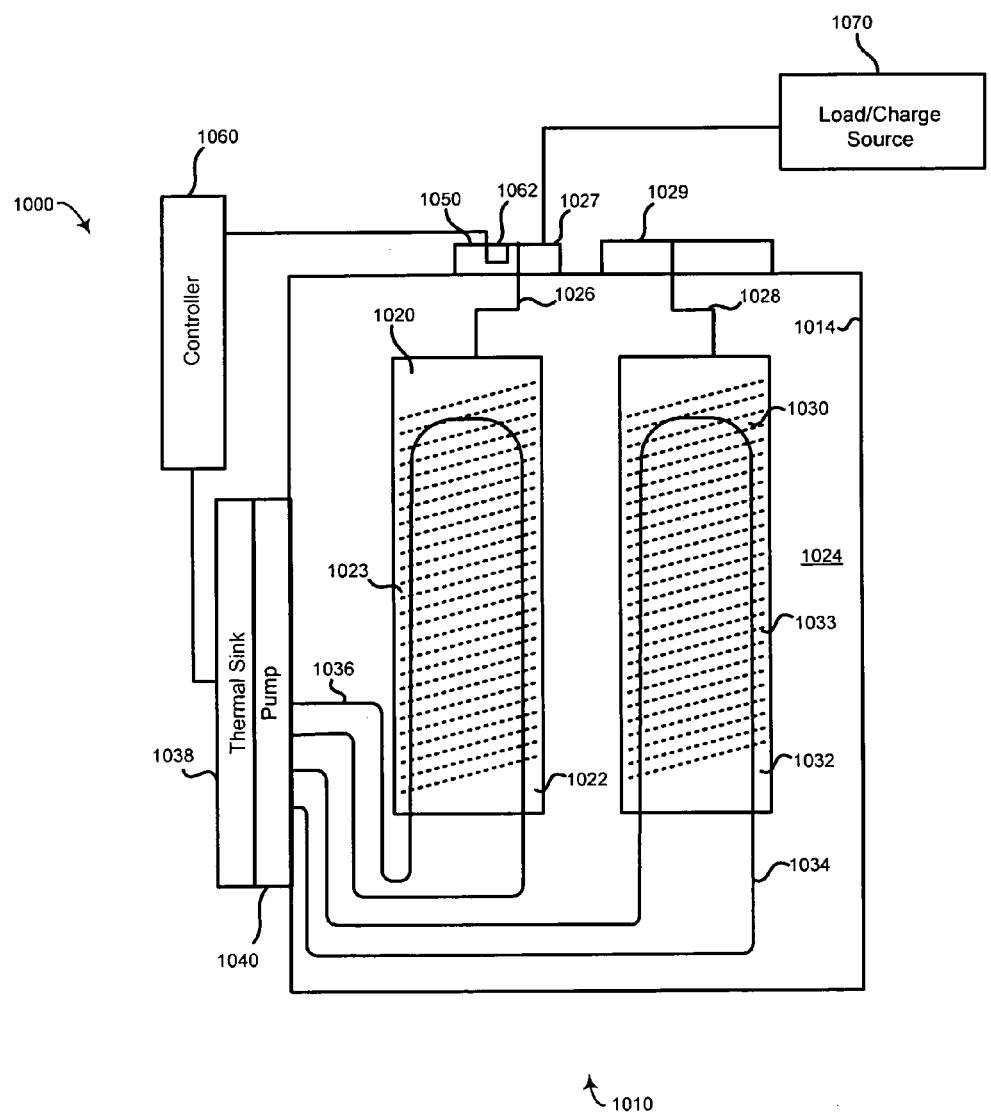
FIG. 10 is an exemplary high thermal conductivity material altering temperature of device associated with an electrical energy storage device or an electrochemical energy generation device.

Referring now to FIG. 10, a system 1000 for thermal control of an electrical energy storage device or an electrochemical energy generation device is depicted. Electrical energy storage device or electrochemical energy generation device 1000 may include a housing 1010 having an outer surface 1012 and an inner surface 1014. Within housing 1010 may be a plurality of components, chemicals, materials, etc. For example, a cathode 1020 may be coupled to a positive terminal 1027 by a conductive connection 1026. Cathode 1020 may have a surface 1022. Surface 1022 may be overlaid with or be integrated into cathode 1020 a high thermal conductivity material 1023 that is in thermal communication with the fluid circuit 1036. High thermal conductivity material 1023 may have a high k-value. The high k-value may be greater than approximately 410 W/(m*K). Fluid circuit 1036 may be used to circulate fluid to conduct heat away from cathode 1020 via the high thermal conductivity of the material 1023.

In electrical energy storage devices and electrochemical energy generation devices that are charged or discharged rapidly or that manage a high power density, efficient thermal control is needed to maintain desired temperature. The use of high thermal conductivity materials as applied, allows efficient rejection of heat to maintain desired temperatures. Thermal circuit 1036 is coupled to a thermal sink 1038 and optionally through a pump, 1040. Pump 1040 helps move fluid through circuit 1036. Similarly, an anode 1030 may reside within housing 1010 having a high thermal conductivity material 1033 coupled to or integrated into surface 1032. A fluid circuit 1034 is in thermal communication with material 1033. Fluid circuit 1034 is coupled to thermal sink 1038 optionally through a pump 1040. Anode 1030 is electrically coupled to a negative terminal 1029 through conductive connection 1028. Positive terminal 1027 and negative terminal 1029 may be coupled to a load or charge source 1070. In an exemplary embodiment a controller 1060 may be coupled to any of a variety of mechanisms within system 1000 including, but not limited to, pump 1040 for controlling the rate of fluid flow within circuits 1036 and 1038, for example. Controller 1060 may be coupled to any of a variety of sensors including, but not limited to a current sensor 1062 which may be in a variety of locations including, but not limited to at terminal 1027. Many other types of sensors may also be used including, but not limited to temperature sensors, voltage sensors, flow sensors, chemical concentration sensors, and the like. The use of high thermal conductivity materials to aid the rejection of heat within the interior of an electrical energy storage device or an electrochemical energy generation device may be beneficial to provide adequate thermal control of such devices during rapid charging or rapid discharging, etc.

In various exemplary embodiments, the electrical energy storage device or the electrochemical energy generation device includes high thermal conductivity materials which include but are not limited to diamond and diamond based materials, diamond films, diamond composites (such as diamond-loaded copper or diamond-loaded aluminum), carbon fibers (including graphite fiber composites, as may exist in combination with materials in a matrix such as aluminum, Silicon Carbide (SiC), or various polymers), carbon-carbon materials (such as carbon fibers in a carbon matrix), carbon nanotubes, carbon aerogels and the like. Further, the high thermal conductivity materials may be formed into micro heat pipes, and other structures which will be beneficial to increase thermal conductivity. Such materials are exemplified in the following references: (1) information found at http://www.nsf.gov/awardsearch/showAward.do?AwardNumber=0750177 as of Apr. 30, 2009, (2) "Applications for ultra-high thermal conductivity graphite fibers," T. F. Fleming, W. C. Riley, Proc. SPIE, Vol. 1997, 136 (1993) DOI:10.1117/12.163796, Online Publication Date: 14 Jan. 2005; "Vapor grown carbon fiber reinforced aluminum composites with very high thermal conductivity," Jyh-Ming Ting, Max L. Lake J. Mater. Res. V. 10 #2 pp. 247-250 DOI: 10.1557/JMR.1995.0247 and (3) "New low-CTE ultrahigh-thermal-conductivity materials for lidar laser diode packaging," C. Zweben Proc. SPIE, Vol. 5887, 58870D (2005) DOI: 10.1117/12.620175.

Figure 11:
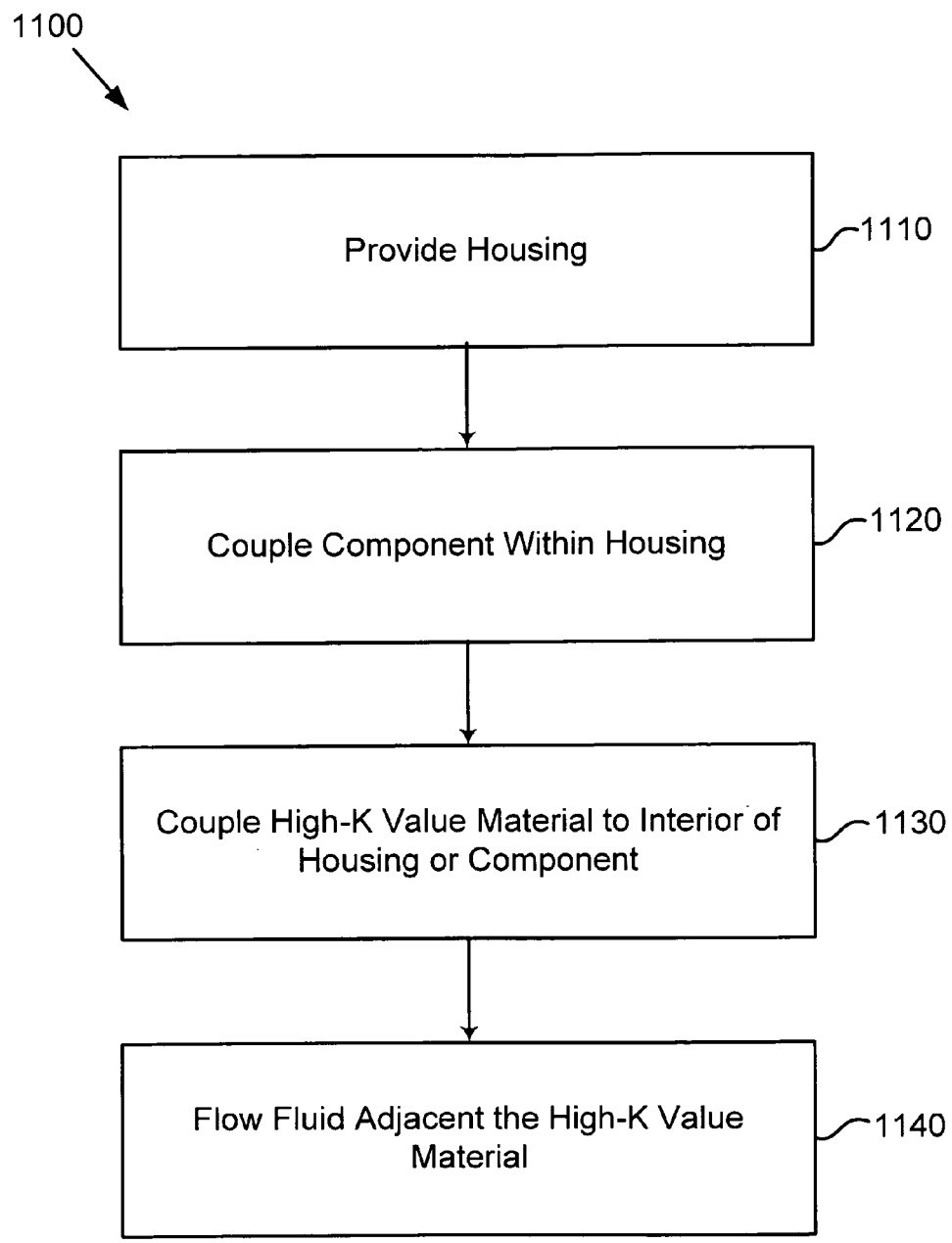
FIG. 11 is an exemplary process diagram for altering temperature of an electrical energy storage device or an electrochemical energy generation device using high thermal conductivity materials.

Referring now to FIG. 11, a method 1100 of thermal control of an electrical energy storage device or an electrochemical energy generation device is depicted. The method includes providing a housing which may have an external surface and an internal surface (process 1110). The method also includes coupling at least one component within the housing. At least one component is configured to generate electrical power in combination with other components, chemicals, or materials which may be residing within the housing (process 1120). Further, the method includes forming a plurality of thermal control structures of a high thermal conductivity material which is coupled to at least one of the internal surface of the housing or the least one internal components. The high thermal conductive material may have a high k-value, the high k-value being greater than approximately 410 W/(m*K) (process 1130). Further still, the method includes flowing a fluid adjacent the high thermal conductivity material to remove heat from the high thermal conductivity material (process 1140).

In another exemplary embodiment, the thermal sink may be formed at least partially of a high thermal conductivity material as described above. Such a structure may be used in a method of thermal control of an electrical energy storage device or an electrochemical energy generation device. Such a method may include providing a housing having an external surface and an internal surface. The method may also include coupling at least one component within the housing, at least one component being configured to generate electrical power in combination with other components, chemicals, or materials residing within the housing. Further, the method of thermal control may include forming a plurality of thermal control structures coupled to at least one of the internal surface of the housing or the at least one internal components. The method further includes flowing a fluid adjacent a plurality of thermal control structures and transferring heat to or from a thermal sink. The thermal sink is formed at least partially of a high thermal conductive material having a high k-value. The high k-value may be greater than approximately 410 W/(m*K).

Figure 12:
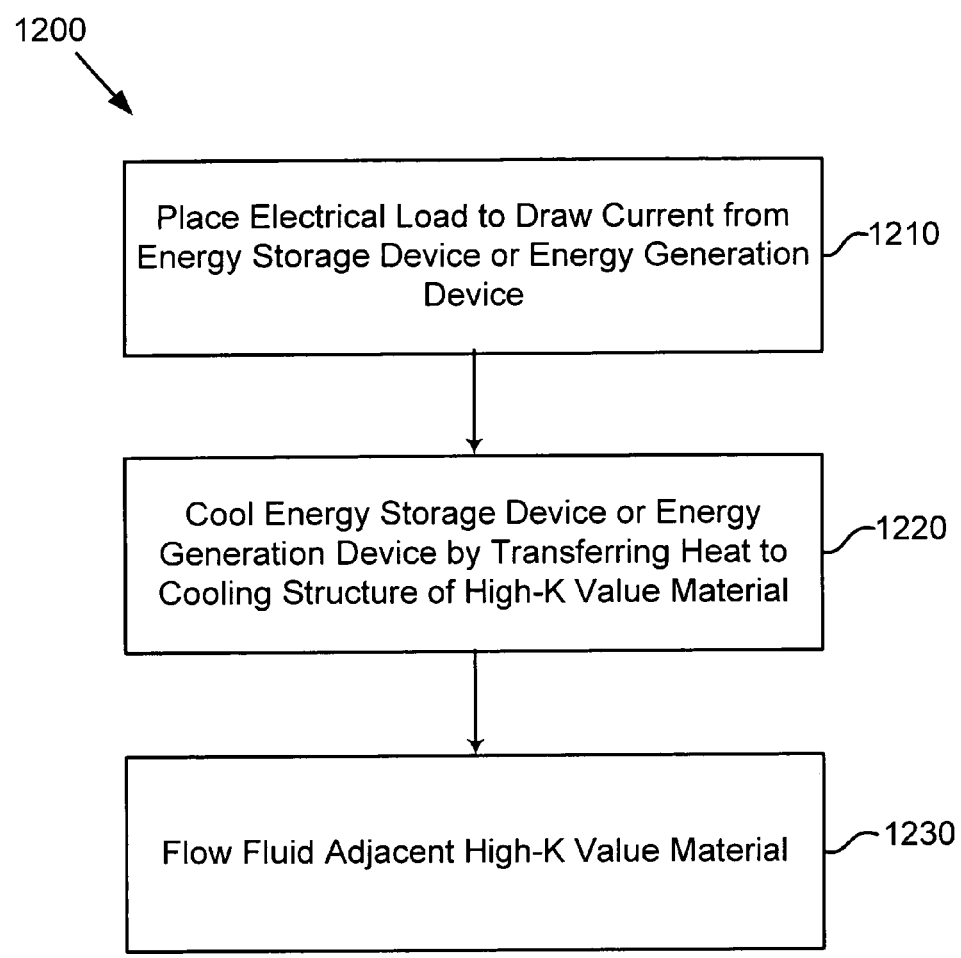
FIG. 12 is an exemplary process diagram for altering temperature of an electrical energy storage device or an electrochemical energy generation device using high thermal conductivity materials during discharge.

Referring now to FIG. 12, a process of thermal control of an electrical energy storage device or an electrochemical energy generation device 1200 is depicted. Process 1200 may include placing an electrical load to draw current from the electrical energy storage device or the electrochemical energy generation device (process 1210). Process 1200 may also include thermal control of the electrical energy storage device or electrochemical energy generation device by transferring heat to thermal control structures which are formed of a high k-value material (process 1220). Further, process 1200 includes flowing fluid adjacent the high k-value material to remove heat therefrom (process 1230).

Figure 13:
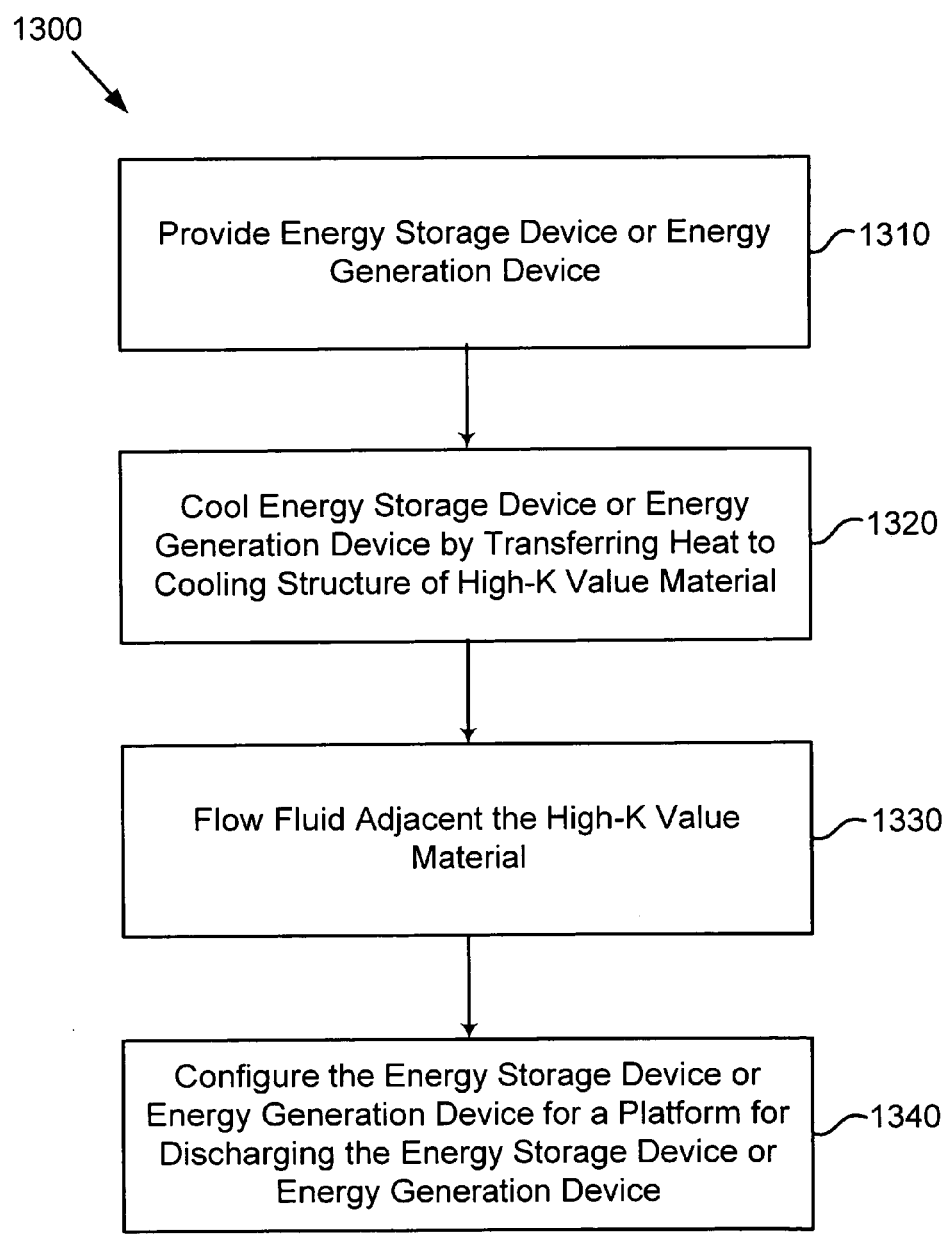
FIG. 13 is an exemplary process diagram of an electrical energy storage device or an electrochemical energy generation device using high thermal conductivity materials during discharging.

Referring now to FIG. 13, a method 1300 for providing power from an electrical energy storage device or an electrochemical energy generation device includes providing the electrical energy storage device or the electrochemical energy generation device. The electrical energy storage device or the electrochemical energy generation device includes a housing and includes internal components within the housing (process 1310). Process 1300 also includes thermal control of the electrical energy storage device or the electrochemical energy generation device by transferring heat to thermal control structures which are formed of high k-value material (process 1320). Further, process 1300 includes flowing fluid adjacent the high k-value material (process 1330). Further still, process 1300 includes configuring the electrical energy storage device or the electrochemical energy generation device for a platform for discharging the electrical energy storage device or the electrochemical energy generation device (process 1340).

Figure 14:
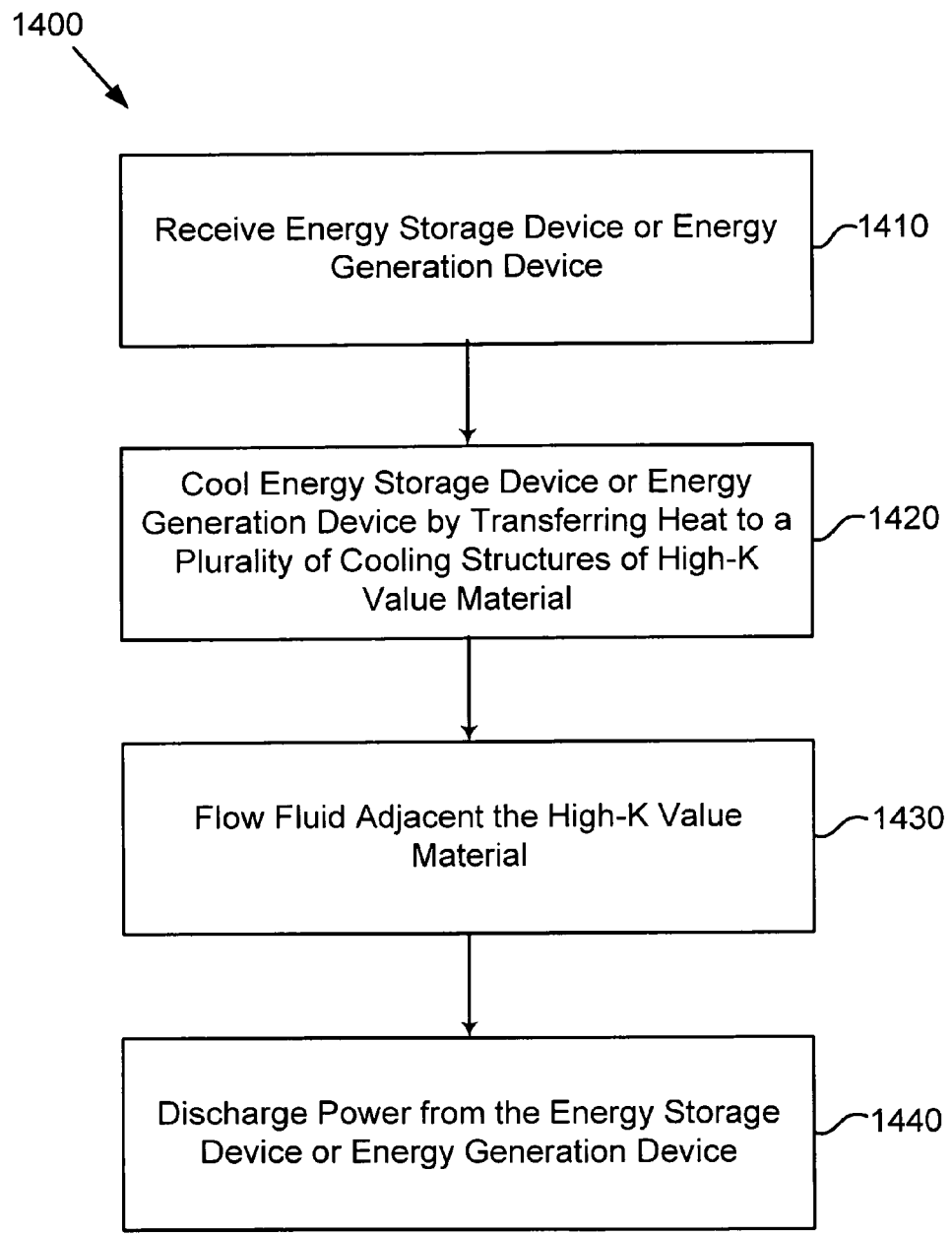
FIG. 14 is an exemplary process diagram for altering temperature of an electrical energy storage device for an electrochemical energy generation device during discharging.

Referring now to FIG. 14, a method 1400 of providing power from an electrical energy storage device or an electrochemical energy generation device includes providing the electrical energy storage device or the electrochemical energy generation device with a housing and with internal components within the housing (process 1410). The method also includes thermal control of the electrical energy storage device or the electrochemical energy generation device by transferring heat to a plurality of thermal control of structures formed of high k-value material (process 1420). Further, the method includes flowing fluid adjacent the high k-value materials (process 1430). Further still, process 1400 includes configuring the electrical energy storage device or the electrochemical energy generation device for a platform for discharging the electrical energy storage device or the electrochemical energy generation device and using the electrical energy from the electrical energy storage device or the electrochemical energy generation device (process 1400).

Figure 15:
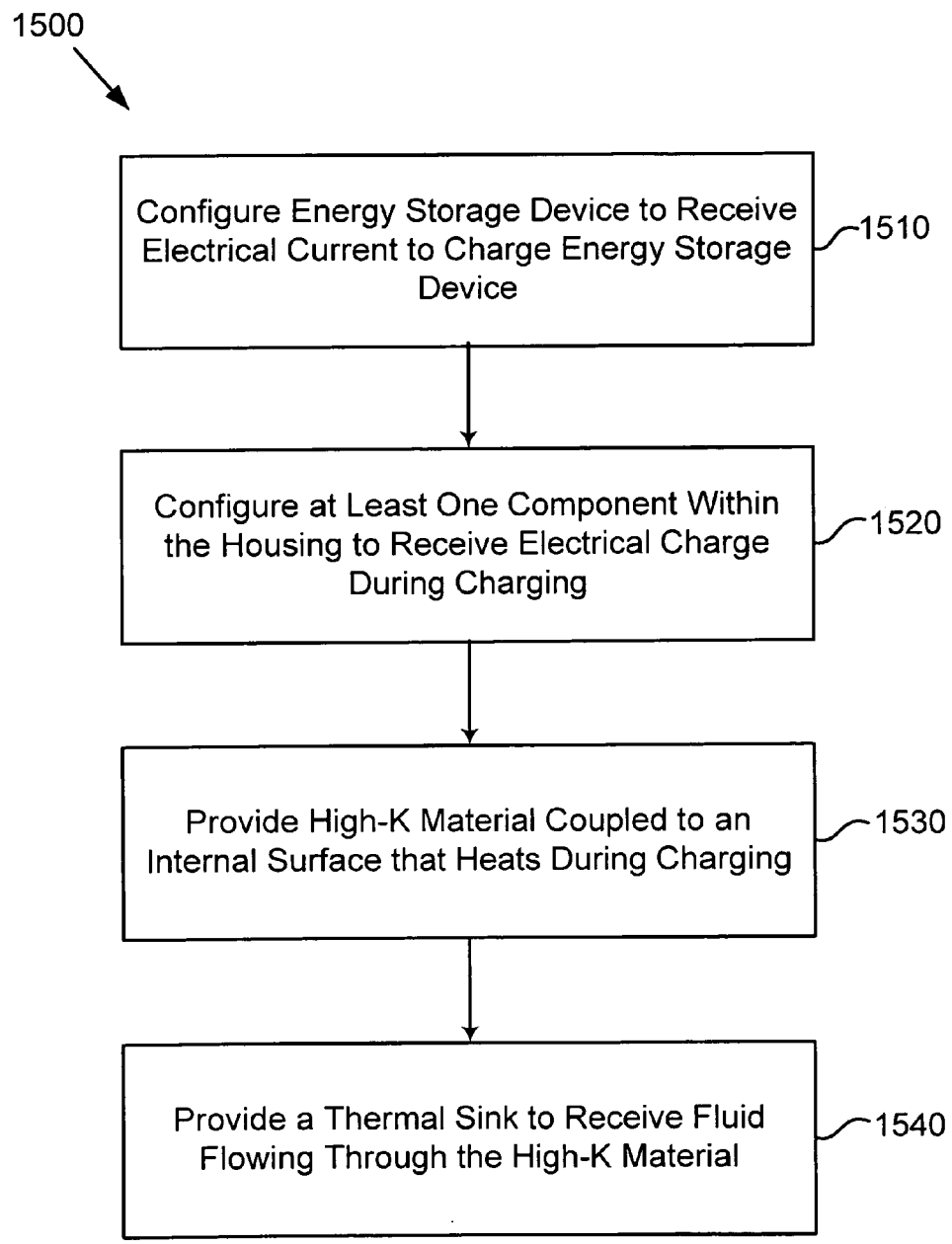
FIG. 15 is an exemplary process diagram for an electrical energy storage device using high thermal conductivity materials during charging.

Referring now to FIG. 15, a method 1500 of charging an electrical energy storage device may include configuring the electrical energy storage device to receive electrical current to charge the electrical energy storage device (process 1510). The electrical energy storage device may include a housing having an external surface and an internal surface. The method may also include configuring at least one component within the housing. The least one component is configured to generate electrical energy, during a discharge phase, in combination with other components chemicals or materials residing within housing and at least one component configured to receive electrical charge during a charge phase (process 1520). A plurality of thermal control structures are provided of a high thermal conductivity material coupled to at least one of the internal surface of the housing or the least one internal components (process 1520). The high thermal conductivity material may have a high k-value the high k-value is greater than approximately 410 W/(m*K). The thermal conductivity material is configured to receive heat generated during the charge phase (process 1530). A thermal sink is provided to transfer heat to or from the fluid coupled to the high thermal conductivity material (process 1540). A thermal sink is configured to transfer heat energy to or from the fluid flowing through the high thermal conductivity material and the thermal sink.

Figure 16:
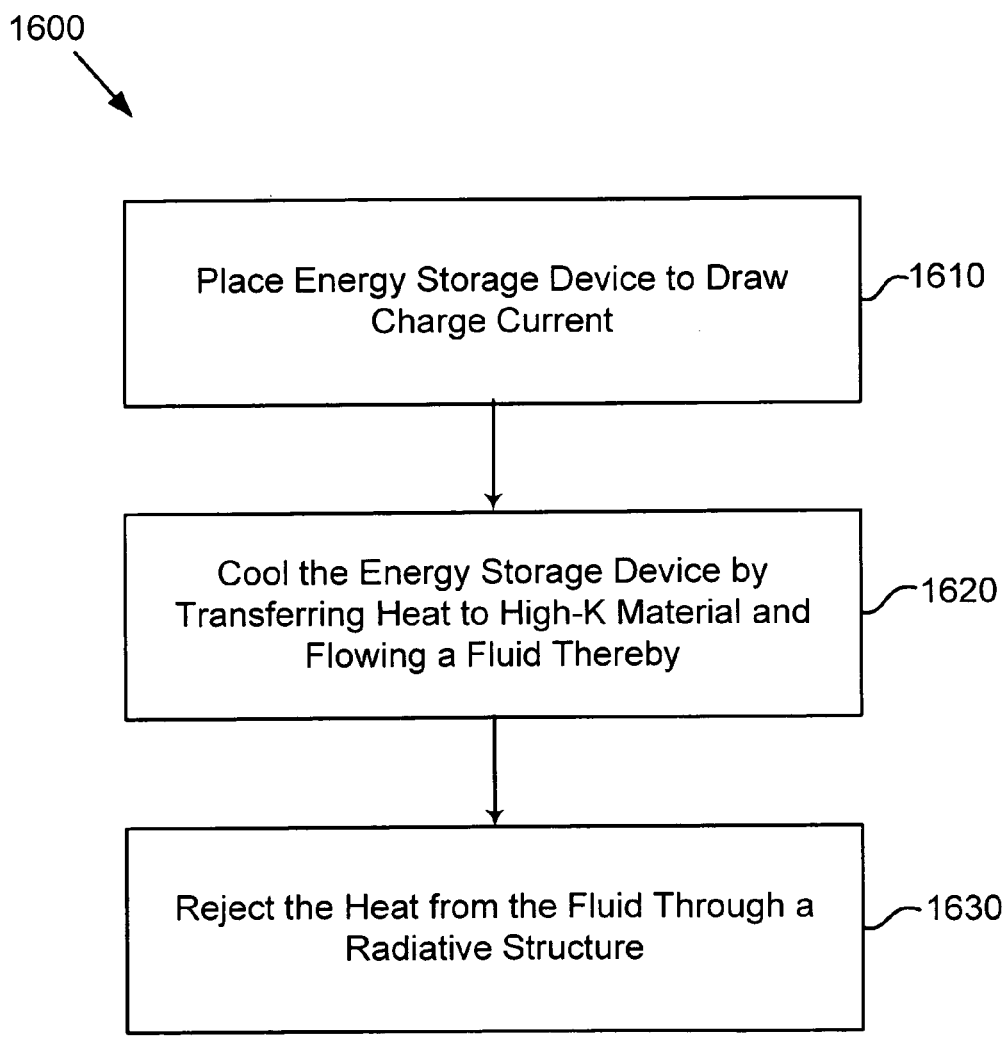
FIG. 16 is an exemplary process diagram for altering temperature of an electrical energy storage device using high thermal conductivity materials during charging.

Referring now to FIG. 16, a method 1600 of charging an electrical energy storage device includes placing the electrical energy storage device in a situation to draw charge current (process 1600). Process 1600 also includes thermal control of the electrical energy storage device by transferring heat to a plurality of thermal control structures formed of high thermal conductivity material and flowing fluid thereby (process 1620). Process 1600 also includes rejecting heat from the fluid through a radiative structure or a thermal sink (process 1630).

In another exemplary embodiment, structures, systems, and processes described above may also be applied to structures, systems, and processes which use microchannel thermal control for thermal control of electrical energy storage devices or electrochemical energy generation devices and base such thermal control on current (or other states of the electrical energy storage device or electrochemical energy generation device, such as (but not limited to voltage, power, temperature, charge state, etc.) that is either delivered to or from the electrical energy storage device or the electrochemical energy generation device. The current may be sensed by a variety of sensors and controlled by a pump that controls the rate of fluid flow using any of a variety of control algorithms and controllers. Such control algorithms may include but are not limited to classical control, feedback control, nonlinear control, adaptive control, etc. The control algorithms may also include state estimator's, adaptive control algorithms, Kalman filters, models of the electrical energy storage device or the electrochemical energy generation device. The pump may be controlled is any of a variety of ways including increased flow as current draw increase, flow may be increased linearly as current draw increase, flow may be decreased as current draw decreased, flow may be decreased nonlinearly as current draw decreases, flow may be increased linearly as current draw increases, flow may be decreased nonlinearly as current draw decreases, or flow may be increased nonlinearly as current draw increases and flow may be decreased linearly as current draw decreases. Further, other possibilities are equally applicable depending on the design specifications and desired responses.

In another exemplary embodiment, structures, systems, and processes described above may also be applied to structures, systems, and processes which use high thermal conductivity materials and for thermal control of electrical energy storage devices or electrochemical energy generation devices and base such thermal control on a state or states of a mobile device which the electrical energy storage device or electrochemical energy generation device is powering. The current may be sensed by a variety of sensors or by software which determines the state of the mobile device and a pump is controlled that controls the rate of fluid flow using any of a variety of control algorithms and controllers. Such control algorithms may include but are not limited to classical control, feedback control, nonlinear control, adaptive control, etc. The control algorithms may also include state estimator's, adaptive control algorithms, Kalman filters, models of the electrical energy storage device or the electrochemical energy generation device, etc.

The mobile device states on which fluid flow may be based may include any of a variety of states including but not limited to brightness, processing speed, processing demands, processor tasks, display brightness, hard disk state, hard disk speed, hard disk usage, wireless communication state, etc. Such a mobile device may include any of a variety of mobile electronic devices including, but not limited to, a computer, a laptop computer, a mobile phone, a global positioning system (GPS) unit, a power tool, etc. Further, other possibilities are equally applicable depending on the performance characteristics desired.

For example, in accordance with an exemplary embodiment, the mobile device may be a laptop computer having a battery pack that is cooled by a microchannel thermal control system. The microchannel thermal control system may include a pump or other device that controls the rate of fluid flow through the microchannels and thus the rate of thermal control. Because current demands may cause heating of the battery pack due to increased processing speed, increased processing tasks, increased hard disk speed, increased hard disk usage, etc. As discussed above, the demands for thermal control therefore increase. The control system is configured to detect or determine the state of the mobile device and make adjustments to the rate of thermal control by altering the rate of flow through the microchannel system thermal control based on mobile device states may be applied in the context of microchannel-based thermal control, high thermal conductivity material-based thermal control systems, and further microchannel and high thermal conductivity material thermal control systems.

The use of such a system in which control of fluid flow is based on mobile device states may be applied to a thermal control system which uses microchannels. Similarly, the system may be applied to an electrochemical energy generation device or electrical energy storage device that uses thermal and high thermal conduct to the materials in conjunction with a fluid thermal control system. Further, the control system described in which thermal control is based on mobile device states may also be applied to a system which uses a combination of microchannel thermal control and high thermal conductivity to the materials.

In another particular exemplary embodiment, the fluid thermal control system described above may be applied to electrical energy storage devices and energy to generation devices that are used in vehicle systems. In such a system a fluid pump may be coupled to a microchannel thermal control system of the electrical energy storage device or the electrochemical energy generation device. The electrical energy storage device or the electrochemical energy generation device may be configured to provide electrical energy to the drivetrain of the vehicle or in powering other equipment in the vehicle. A processor is configured to determine at least one of the states of the vehicle. A vehicle sensor may be coupled to the processor and may be configured to sense at least one vehicle characteristic. A controller is used with a control algorithm and maybe configured to control the functioning of the pump as a function of at least one vehicle state.

In accordance with an exemplary embodiment, the vehicle states may include but are not limited to engine speed, engine torque, engine acceleration, engine temperature, terrain grade, vehicle acceleration, vehicle speed, etc. Also, the concept and control system may be applied to any of a variety of vehicles including, but not limited to, a computer integrated into a vehicle, a truck, a boat, a bus, train, an automobile, etc. In other exemplary embodiments, a variety of sensors may be used including but not limited to current sensors, voltage sensors, temperature sensors, speed sensors, accelerometers, orientation sensors, attitude sensors, etc. The methods of applying thermal control based on vehicle states may be applied in the context of microchannel-based thermal control, high thermal conductivity material-based thermal control systems, and further microchannel and high thermal conductivity material thermal control systems.

In another exemplary embodiment, an electrical energy storage device or electrochemical energy generation device includes a housing having an external surface and an internal surface. Components may reside within the housing. The components are configured to generate electrical energy in combination with at least one of other components, chemicals, or materials residing within the housing. A plurality of microchannels may be fashioned to at least one of the internal surface of the housing or the at least one internal components. The plurality of microchannels may be divided into at least two sets of microchannels although any number of sets may be used. The two sets, for example, may be separated by at least one valve. A controller is configured to provide control signals to the valve. The valve may be configured to control fluid flow in at least two sets of microchannel such that fluid could flow through either set of microchannels or both sets simultaneously. The control signals are based on thermal control demand. For example, the thermal control demand may be of the overall system, or the thermal control demand may be localized. A thermal sink is coupled to the microchannels. The thermal sink is configured to transfer heat energy to or from the microchannel surfaces via the fluid flowing through the microchannel and the sinks. In such an embodiment, the thermal control demands may be met by controlling the action of opening or closing of the valves such that fluid may selectively flow through various sets of microchannel to provide needed localized thermal control.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.). Further, those skilled in the art will recognize that the mechanical structures disclosed are exemplary structures and many other forms and materials may be employed in constructing such structures.

In a general sense, those skilled in the art will recognize that the various embodiments described herein can be implemented, individually and/or collectively, by various types of electromechanical systems having a wide range of electrical components such as hardware, software, firmware, or virtually any combination thereof; and a wide range of components that may impart mechanical force or motion such as rigid bodies, spring or torsional bodies, hydraulics, and electro-magnetically actuated devices, or virtually any combination thereof. Consequently, as used herein "electromechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs. Those skilled in the art will also appreciate that examples of electromechanical systems include but are not limited to a variety of consumer electronics systems, as well as other systems such as motorized transport systems, factory automation systems, security systems, and communication/computing systems. Those skilled in the art will recognize that electromechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc), or (g) a wired/wireless services entity such as Sprint, Cingular, Nextel, etc.), etc.

One skilled in the art will recognize that the herein described components (e.g., steps), devices, and objects and the discussion accompanying them are used as examples for the sake of conceptual clarity and that various configuration modifications are within the skill of those in the art. Consequently, as used herein, the specific exemplars set forth and the accompanying discussion are intended to be representative of their more general classes. In general, use of any specific exemplar herein is also intended to be representative of its class, and the non-inclusion of such specific components (e.g., steps), devices, and objects herein should not be taken as indicating that limitation is desired.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of operating an electrical energy storage device or an electrochemical energy generation device, comprising:
   placing an electrical load to draw current from the electrical energy storage device or the electrochemical energy generation device, the electrical energy storage device or the electrochemical energy generation device including a housing having an external surface and an internal surface;
   generating electricity by at least one component within the housing, at least one component being configured to generate electrical energy in combination with other components, chemicals, or materials residing within the housing;
   altering the temperature of the electrical energy storage device by transferring heat to a plurality of microchannels coupled to at least one of the internal surface of the housing or at least one components; and
   rejecting the collected heat through a thermal sink coupled to the microchannels, the thermal sink being configured to transfer heat energy from a fluid and to receive the fluid flowing through the microchannels.

2. The method of claim 1, wherein the microchannels are formed in a portion of a wall of the housing.

3. The method of claim 1, wherein the microchannels are formed in a portion of at least one component.

4. The method of claim 1, wherein the microchannels are formed in a portion of at least one component and at least one component includes a cathode.

5. The method of claim 1, wherein the microchannels are formed in a portion of at least one component and at least one component includes an anode.

6. The method of claim 1, wherein the microchannels are formed in the material including a portion of at least one component and at least one component includes a catalyst material.

7. The method of claim 1, wherein the microchannels are formed in a portion of at least one component and at least one component includes a solid electrolyte material.

8. The method of claim 1, wherein the microchannels are formed in a portion of at least one component and at least one component includes an electrical contact.

9. The method of claim 1, wherein the microchannels are formed in a portion of at least one component and at least one component includes a current carrying conductor.

10. The method of claim 1, wherein the microchannels are formed in a portion of at least one component and at least one component includes a material and the material including a dielectric.

11. The method of claim 1, wherein the microchannels are formed in a portion of at least one component and at least one component includes a separator.

12. The method of claim 1, wherein the microchannels are formed at least partially integrally on the internal surface of the housing.

13. The method of claim 1, wherein the microchannels are formed at least partially integrally on a surface of at least one component.

14. The method of claim 1, wherein the microchannels are configured to induce laminar flow of the fluid through at least a portion of the microchannels.

15. The method of claim 1, wherein at least one component includes a thermal control component, and the thermal control component is disposed within the housing.

16. The method of claim 1, wherein the fluid includes air.

17. The method of claim 1, wherein the fluid includes a gas.

18. The method of claim 1, wherein the fluid includes water.

19. The method of claim 1, wherein the fluid includes antifreeze.

20. The method of claim 1, wherein the fluid includes molten salt.

21. The method of claim 1, wherein the fluid includes molten metal.

22. The method of claim 1, wherein the fluid includes micro-particles.

23. The method of claim 1, wherein the fluid includes a phase change material.

24. The method of claim 1, wherein the fluid includes liquid droplets.

25. The method of claim 1, wherein the fluid includes solid particles.

26. The method of claim 1, wherein the fluid is at least partially circulated by a pump.

27. The method of claim 1, wherein the fluid is at least partially circulated by a mechanical pump.

28. The method of claim 1, wherein the fluid is at least partially circulated by electromagnetic forces.

29. The method of claim 1, wherein the fluid is at least partially circulated by an electromagnetic (MHD) pump.

30. The method of claim 1, wherein the fluid is at least partially circulated by an electro osmotic pump.

31. The method of claim 1, wherein the fluid is at least partially circulated by convection.

32. The method of claim 1, wherein the fluid is at least partially circulated by electroosmosis.

33. The method of claim 1, wherein the fluid is at least partially circulated by capillary forces.

34. The method of claim 1, wherein the electrical energy storage device includes one or more vanadium redox cells.

35. The method of claim 1, wherein the electrical energy storage device includes one or more capacitive storage device.

36. The method of claim 1, wherein the electrical energy storage device includes one or more inductive storage devices.

37. The method of claim 1, wherein the electrical energy storage device includes one or more electrolytic capacitors.

38. The method of claim 1, wherein the electrical energy storage device or the electrochemical energy generation device includes a sodium sulfur battery.

39. The method of claim 1, wherein at least one component includes an electrode, and the electrode includes microchannels alternating with current flow pathways.

40. The method of claim 1, wherein the microchannels are formed by etching.

41. A method of providing power from an electrical energy storage device or an electrochemical energy generation device, comprising:
providing the electrical energy storage device or the electrochemical energy generation device including a housing and including internal components within the housing;
providing a microchannel fluid thermal control system integrated into at least one of the interior of the housing or the internal components; and
configuring the electrical energy storage device or the electrochemical energy generation device for a platform for at least partially discharging the electrical energy storage device or the electrochemical energy generation device and using electrical energy from the electrical energy storage device or the electrochemical energy generation device.

42. A method of providing power from an electrical energy storage device or an electrochemical energy generation device, comprising:
receiving the electrical energy storage device or the electrochemical energy generation device including a housing and including internal components within the housing;
receiving a microchannel fluid thermal control system integrated into at least one of the interior of the housing or the internal components;
discharging power at least partially from the electrical energy storage device or the electrochemical energy generation device, the electrical energy storage device or the electrochemical energy generation device configured for a platform for discharging the power source and using the electrical energy from the electrical energy storage device or the electrochemical energy generation device; and
discharging heat from the fluid flowing through the microchannel fluid thermal control system.

43. A method of charging an electrical energy storage device, comprising:
configuring the electrical energy storage device to receive electrical current to charge the electrical energy storage device, the electrical energy storage device including a housing having an external surface and an internal surface;
configuring at least one component within the housing, at least one component being configured to generate electrical energy, during a discharge phase, in combination with other components, chemicals, or materials residing within the housing and at least one component configured to receive electrical charge during a charge phase;
providing a plurality of microchannels coupled to at least one of the internal surface of the housing or the at least one internal components to receive heat generated during the charge phase and providing a fluid within the microchannels; and
providing a thermal sink, to collect the heat from the fluid, coupled to the microchannels, the thermal sink being configured to transfer heat energy to or from the fluid flowing through the microchannels and the thermal sink.

44. A method of charging an electrical energy storage device, comprising:
placing the electrical energy storage device to draw current from a charging source, the electrical energy storage device including a housing having an external surface and an internal surface;
receiving electricity by at least one component within the housing, at least one component being configured to receive electrical energy in combination with other components, chemicals, or materials residing within the housing;
altering the temperature of the electrical energy storage device by transferring heat to a plurality of microchannels coupled to at least one of the internal surface of the housing or the at least one internal components; and
transferring collected heat through a thermal sink coupled to the microchannels, the thermal sink being configured to transfer heat energy to or from the microchannel and receive a fluid flowing through the microchannels and the thermal sink.

* * * * *